United States Patent
Soma et al.

(10) Patent No.: US 6,775,321 B1
(45) Date of Patent: Aug. 10, 2004

(54) APPARATUS FOR AND METHOD OF MEASURING A JITTER

(75) Inventors: Mani Soma, Seattle, WA (US); Masahiro Ishida, Tokyo (JP); Takahiro Yamaguchi, Tokyo (JP); Toshifumi Watanabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 732 days.

(21) Appl. No.: 09/703,469

(22) Filed: Oct. 31, 2000

(51) Int. Cl.[7] ............................................. H04B 17/00
(52) U.S. Cl. ....................................... 375/226; 702/69
(58) Field of Search ............................... 375/226, 371; 702/69; 324/76.77, 86

(56) References Cited

U.S. PATENT DOCUMENTS 5,923,706 A * 7/1999 Marz .......................... 375/226
6,331,999 B1 * 12/2001 Ducaroir et al. ............ 375/226

FOREIGN PATENT DOCUMENTS

WO     WO0046606        8/2000

* cited by examiner

*Primary Examiner*—Stephen Chin
*Assistant Examiner*—Kevin Kim
(74) *Attorney, Agent, or Firm*—David N. Lathrop, Esq.; Gallagher & Lathrop

(57) ABSTRACT

A signal under measurement is transformed into a complex analytic signal using Hilbert transformation to estimate an instantaneous phase of the signal under measurement from the complex analytic signal. A least mean square line of the instantaneous phase is calculated to obtain a linear instantaneous phase of the signal under measurement, and a zero-crossing timing of the signal under measurement is estimated using an interpolation method. Then a difference between the instantaneous phase and the linear instantaneous phase at the zero-crossing timing is calculated to estimate a timing jitter sequence. A jitter of the signal under measurement is obtained from the jitter sequence.

28 Claims, 34 Drawing Sheets

Jitter Measurement Apparatus 100

PRIOR ART

PRIOR ART

|  | MEASURED | 1-SIGMA | PK-PK | MAXIMUM | MINIMUM | EVENTS | # PASSES |
|---|---|---|---|---|---|---|---|
| LATEST | 2479.1 | 7.56 | 37.2 | 2497.6 | 2460.3 | 500 |  |
| OVERALL | 2478.5 | 7.72 | 48.2 | 2504.9 | 2456.7 | 10000 | 20 |

Number of Events: 4,573
RMS Jitter: 8.47 ps
Peak-to-Peak Jitter: 52.0 ps

| Method | | No. of Events | $J_{RMS}$ | $J_{PP}$ |
|---|---|---|---|---|
| Time Interval Analyzer | | 10,000 | 7.72 ps | 48.2 ps |
| Δϕ Method | | 4,696 | 7.49 ps | 45.5 ps |
| Proposed Method | | 4,696 | 7.48 ps | 45.5 ps |
| Difference | Proposed Method vs Time Interval Analyzer | -53% | -3.1% | +1.0% |
| | Proposed Method vs Δϕ Method | 0% | -0.1% | 0% |

APPARATUS FOR AND METHOD OF MEASURING A JITTER

BACKGROUND OF THE INVENTION

The present invention relates to a jitter measurement apparatus and a jitter measurement method.

A Time Interval Analyzer or an oscilloscope has conventionally been used in a period jitter measurement. Each of those methods is called a Zero-crossing Method. As shown in FIG. 1, for example, a clock signal (a signal under measurement) x(t) from a PLL (Phase-Locked Loop) under test 11 is supplied to a time interval analyzer 12. Regarding a signal under measurement x(t), a next rising edge following one rising edge fluctuates against the preceding rising edge as indicated by dotted lines. That is, a time interval $T_p$ between two rising edges, namely a period fluctuates. In the Zero-crossing Method, a time interval between zero-crossings (period) is measured, a relative fluctuation of period is measured by a histogram analysis, and its histogram is displayed as shown in FIG. 2. A time interval analyzer is described in, for example, "Phase Digitizing Sharpens Timing Measurements" by D. Chu, IEEE Spectrum, pp.28–32, 1988 and "A Method of Serial Data Jitter Analysis Using One-Shot Time Interval Measurements" by J. Wilstrup, Proceedings of IEEE International Test Conference, pp.819–823, 1998.

On the other hand, Tektronix, Inc. and LeCroy co. have recently been providing digital oscilloscopes each being able to measure a jitter using an interpolation method. In this jitter measurement method using the interpolation method (interpolation-based jitter measurement method), an interval between data having signal values close to a zero-crossing out of measured data of a sampled signal under measurement is interpolated to estimate a timing of zero-crossing. That is, a time interval between zero-crossings (period) is estimated with a small error to measure a relative fluctuation of period.

That is, as shown in FIG. 3, a signal under measurement x(t) from the PLL under test 11 is inputted to a digital oscilloscope 14. In the digital oscilloscope 14, as shown in FIG. 4, the inputted signal under measurement x(t) is converted into a digital signal data sequence by an analog-to-digital converter 15. A data-interpolation is applied to an interval between data having signal values close to a zero-crossing in the digital data sequence by an interpolator 16. With respect to the data-interpolated digital data sequence, a time interval between zero-crossings is measured by a period estimator 17. A histogram of the measured values is displayed by a histogram estimator 18, and a root-mean-square value and a peak-to-peak value of fluctuations of the measured time intervals are obtained by an RMS & Peak-to-Peak Detector 19. For example, in the case in which a signal under measurement x(t) has a waveform shown in FIG. 5A, its period jitters are measured as shown in FIG. 5B.

On the contrary, we have proposed a Δϕ method for measuring a jitter by obtaining a variable component (phase noise) of an instantaneous phase of a signal under measurement. This Δϕ method is characterized in that an instantaneous phase of a signal under measurement is estimated using an analytic signal theory. FIG. 6 shows a processing block diagram of the Δϕ method. An input signal is transformed into a complex analytic signal by a Hilbert pair generator 21. An instantaneous phase of an input signal is obtained from the complex analytic signal by an instantaneous phase estimator 22. A linear phase component is removed from the instantaneous phase by a linear trend remover 23 to extract a phase noise. With respect to this phase noise, a sample value closest to a zero-crossing point in a real part of the complex analytic signal is extracted by a zero-crossing resampler 24 to obtain a timing jitter sequence. A peak-to-peak value of the output of the zero-crossing resampler 24 is obtained by a $\Delta\phi_{PP}$ detector 25 as a peak-to-peak jitter $\Delta\phi_{PP}$ of the input signal. In addition, a root-mean-square value of the output of the zero-crossing resampler 24 is obtained by a $\Delta\phi_{RMS}$ detector 26 as a root-mean-square value $\Delta\phi_{RMS}$ of jitter of the input signal. Furthermore, a histogram of each sample value of the resampler 24 is displayed and estimated by a histogram estimator 27. This Δϕ method is described in, for example, "Extraction of Peak-to-Peak and RMS Sinusoidal Jitter Using an Analytic Signal Method" by T. J. Yamaguchi, M. Soma, M. Ishida, T. Watanabe, and T. Ohlmi, Proceedings of 18th IEEE VLSI Test Symposium, pp. 395–402, 2000.

In the jitter measurement method by the time interval analyzer method, a time interval between zero-crossings is measured. Therefore a correct measurement can be performed. However, since there is, in this jitter measurement method, a dead-time when no measurement can be performed after one period measurement, there is a problem that it takes a long time to acquire a number of data that are required for a histogram analysis. In addition, in an interpolation-based jitter measurement method in which a wide-band oscilloscope and an interpolation method are combined, there is a problem that a jitter is overestimated (overestimation). That is, there is no compatibility in measured jitter values between this jitter measurement method and the time interval analyzer method. For example, a result of jitter measurement using a time interval analyzer for a clock signal of 400 MHz is shown in FIG. 7A, and a result of jitter measurement using an interpolation-based jitter measurement method for the same clock signal is shown in FIG. 7B.

Those measured results are, a measured value by the time interval analyzer 7.72 ps (RMS) vs. a measured value by the interpolation-based jitter measurement method 8.47 ps (RMS), and the latter is larger, i.e., the measured value by interpolation-based jitter measurement method has overestimated the jitter value. In addition, the interpolation-based jitter measurement method cannot correctly estimate a Gaussian distribution having single peak.

It is an object of the present invention to provide a jitter measurement apparatus and its method that can estimate a jitter value having compatibility, similarly to the Δϕ method, with a conventional time interval analyzer method, i.e., a correct jitter value in a shorter time period.

SUMMARY OF THE INVENTION

The jitter measurement apparatus according to the present invention comprises: analytic signal transformation means for transforming a signal under measurement into a complex analytic signal; instantaneous phase estimation means for obtaining an instantaneous phase of the signal under measurement from the complex analytic signal transformed by the analytic signal transformation means; linear instantaneous phase estimation means for obtaining a linear instantaneous phase of an ideal signal that does not contain a jitter by obtaining a least mean square line of the estimated instantaneous phase; zero-crossing timing estimation means for obtaining a zero-crossing timing of the signal under measurement using an interpolation method or an inverse interpolation method; timing jitter estimation means for calculating a difference between an instantaneous phase value of the signal under measurement and a linear instantaneous phase value of the ideal signal at the zero-crossing timing estimated by the zero-crossing timing estimation means to obtain a timing jitter sequence; and a jitter detection means to which the timing jitter sequence is supplied for obtaining a jitter of the signal under measurement.

In addition, it is desirable that the jitter measurement apparatus further comprises period jitter estimation means to which the timing jitter sequence is inputted for calculating its differential sequence and for outputting a period jitter sequence of the signal under measurement to supply it to the jitter detection means.

In addition, it is desirable that the jitter measurement apparatus further comprises cycle-to-cycle period jitter estimation means to which the period jitter sequence is inputted for calculating its differential sequence and for outputting a cycle-to-cycle period jitter sequence to supply it to the jitter detection means.

In addition, it is desirable that the zero-crossing timing estimation means comprises: linear instantaneous phase data interpolation means to which the linear instantaneous phase data are supplied for interpolating linear instantaneous phase data between a plurality of linear instantaneous phase data around a predetermined phase value in the linear instantaneous phase data; zero-crossing data determination means for determining a data closest to the predetermined value in the data-interpolated linear instantaneous phase data; and timing estimation means for estimating a timing of the determined data.

Alternatively, it is desirable that the zero-crossing timing estimation means is means to which the linear instantaneous phase data are supplied for estimating a zero-crossing timing by the inverse interpolation method form a plurality of linear instantaneous phase data around a predetermined phase value in the linear instantaneous phase data and for outputting the zero-crossing timing.

Or, it is desirable that the zero-crossing timing estimation means comprises: instantaneous phase data interpolation means to which the instantaneous phase data are supplied for interpolating instantaneous phase data between a plurality of instantaneous phase data around a predetermined phase value in the instantaneous phase data; zero-crossing data determination means for determining a data closest to the predetermined phase value in the data-interpolated instantaneous phase data; and timing estimation means for estimating a timing of the determined data.

Or, in the jitter measurement apparatus, it is desirable that the zero-crossing timing estimation means is means to which the instantaneous phase data are supplied for estimating a zero-crossing timing by the inverse interpolation method from a plurality of instantaneous phase data around a predetermined phase value in the instantaneous phase data and for outputting the zero-crossing timing.

Or, it is desirable that the zero-crossing timing estimation means comprises: waveform data interpolation means to which real parts (real signal waveform data) of the complex analytic signal are supplied for interpolating waveform data between a plurality of waveform data around a zero-crossing in the real signal waveform data; zero-crossing data determination means for determining a waveform data closest to the zero-crossing in the data-interpolated real signal waveform data; and timing estimation means for estimating a timing of the determined data.

Or, it is desirable that the zero-crossing timing estimation means is means to which real parts (real signal waveform data) of the complex analytic signal are supplied for estimating a zero-crossing timing by the inverse interpolation method from a plurality of waveform data around zero-crossing in the real signal waveform data and for outputting the zero-crossing timing.

In addition, it is desirable that the analytic signal transformation means comprises: band-pass filtering means to which the signal under measurement is supplied for extracting only components around a fundamental frequency from the signal under measurement to limit the bandwidth of the signal under measurement; and Hilbert transformation means for Hilbert-transforming an output signal of the band-pass filtering means to generate a Hilbert pair of the input signal.

Alternatively, it is desirable that the analytic signal transformation means comprises: time domain to frequency domain transformation means to which the signal under measurement is supplied for transforming the signal under measurement into a both-sided spectrum signal in frequency domain; bandwidth limiting means for extracting only components around a positive fundamental frequency in the both-sided spectrum signal; and frequency domain to time domain transformation means for inverse-transforming an output of the bandwidth limiting means into a signal in time domain.

Or, it is desirable that the analytic signal transformation means comprises: a buffer memory to which the signal under measurement is supplied for storing therein the signal under measurement; means for taking out the signal in the sequential order from the buffer memory such that the signal being taken out is partially overlapped with the signal taken out just before; means for multiplying each taken out partial signal by a window function; means for transforming each partial signal multiplied by the window function into a both-sided spectrum signal in frequency domain; bandwidth limiting means for extracting only components around a positive fundamental frequency of the signal under measurement from the both-sided spectrum signal transformed in frequency domain; means for inverse-transforming an output of the bandwidth limiting means into a signal in time domain; and means for multiplying the signal transformed in time domain by an inverse number of the window function to obtain a band-limited analytic signal.

In addition, it is desirable that the jitter measurement apparatus further comprises AD conversion means for inputting therein the signal under measurement for digitizing and converting an analog signal into a digital signal to input the digital signal to the analytic signal transformation means.

In addition, it is desirable that the jitter measurement apparatus further comprises waveform clipping means to which the signal under measurement is inputted for removing amplitude modulation components of the signal under measurement to supply a signal having only phase modulation components of the signal under measurement to the analytic signal transformation means.

In addition, it is desirable that the jitter detection means is peak-to-peak detection means for obtaining a difference between the maximum value and the minimum value of the supplied jitter sequence.

In addition, it is desirable that the jitter detection means is RMS detection means for obtaining a root mean square value (RMS value) of the supplied jitter sequence.

In addition, it is desirable that the jitter detection means is histogram estimation means for obtaining a histogram of the supplied jitter sequence.

A jitter measurement method according to the present invention has the steps of: transforming a signal under measurement into a complex analytic signal; estimating an instantaneous phase of the signal under measurement from the complex analytic signal; estimating a linear instantaneous phase of an ideal signal that does not contain a jitter by obtaining a least mean square line of the instantaneous phase; estimating a zero-crossing timing of the signal under measurement using the interpolation method or the inverse interpolation method; calculating a difference between an instantaneous phase value of the signal under measurement and a linear instantaneous phase value of the ideal signal at the zero-crossing timing to estimate a timing jitter sequence; and obtaining a jitter of the signal under measurement from the jitter sequence.

In addition, it is desirable that the jitter measurement method has the step of providing the timing jitter sequence as an input for calculating its differential sequence and for outputting a period jitter sequence of the signal under measurement.

In addition, it is desirable that the jitter measurement method has the steps of: providing the timing jitter sequence as an input for calculating its differential sequence and for outputting a period jitter sequence of the signal under measurement; and providing the period jitter sequence as an input for calculating its differential sequence and for outputting a cycle-to-cycle period jitter sequence.

In addition, it is desirable that the step of estimating a zero-crossing timing has the steps of: interpolating linear instantaneous phase data between a plurality of linear instantaneous phase data around a predetermined phase value in the linear instantaneous phase data; determining a data closest to the predetermined phase value in the data-interpolated linear instantaneous phase data; and estimating a timing of the determined data.

Alternatively, it is desirable that the step of estimating the zero-crossing timing is a step of estimating a zero-crossing timing by the inverse interpolation method from a plurality of instantaneous phase data around a predetermined phase value in the instantaneous phase data.

Or, it is desirable that the step of estimating a zero-crossing timing comprises the steps of: interpolating instantaneous phase data between a plurality of instantaneous phase data around a predetermined phase value in the instantaneous phase data; determining a data closest to the predetermined phase value in the data-interpolated instantaneous phase data; and estimating a timing of the determined data.

Or, it is desirable that the step of estimating a zero-crossing timing is a step of estimating a zero-crossing timing by the inverse interpolation method from a plurality of instantaneous phase data around a predetermined phase data in the instantaneous phase data.

Or, it is desirable that the step of estimating a zero-crossing timing comprises the steps of: interpolating waveform data between a plurality of waveform data around a zero-crossing in the real part (real signal waveform data) of the analytic signal; determining a waveform data closest to the zero-crossing in the data-interpolated signal waveform data; and estimating a timing of the determined data.

Or, it is desirable that the step of estimating a zero-crossing timing is a step of estimating a zero-crossing timing by an inverse interpolation method from a plurality of waveform data around a zero-crossing in the real part (real signal waveform data) of the analytic signal.

In addition, it is desirable that the step of interpolating data around the predetermined value is a step of data-interpolating using a polynomial interpolation method.

Attentively, it is desirable that the step of interpolating data around the predetermined value is a step of data-interpolating using a cubic spline interpolation method.

Or, it is desirable that the step of estimating the zero-crossing is a step of using an inverse linear interpolation method.

In addition, it is desirable that the step of transforming the signal under measurement into an analytic signal comprises the steps of: extracting only components around a fundamental frequency from the signal under measurement to limit the bandwidth of the signal under measurement; and Hilbert-transforming the band-limited signal to generate a Hilbert pair of the input signal.

Alternatively, it is desirable that the step of transforming the signal under measurement into an analytic signal comprises the steps of: transforming the signal under measurement into a both-sided spectrum signal in frequency domain; extracting only components around a positive fundamental frequency in the both-sided spectrum signal; and inverse-transforming the extracted components around the positive fundamental frequency into a signal in time domain.

Or, it is desirable that the step of transforming the signal under measurement into an analytic signal comprises the steps of: storing the signal under measurement in a buffer memory; taking out the signal in the sequential order from the buffer memory such that the signal being taken out is partially overlapped with the signal taken out just before; multiplying each taken out partial signal by a window function; transforming each partial signal multiplied by the window function into a both-sided spectrum signal in frequency domain; extracting only components around a positive fundamental frequency of the signal under measurement from the both-sided spectrum signal transformed in frequency domain; inverse-transforming the extracted spectrum signal having components around the positive fundamental frequency into a signal in time domain; and multiplying the signal transformed in time domain by an inverse number of the window function to obtain a band-limited analytic signal.

In addition, it is desirable that the jitter measurement method has a step of performing a waveform-clipping of the signal under measurement to remove amplitude components of the signal under measurement and to extract a signal containing only phase modulation components of the signal under measurement, and for transferring the signal to the step of transforming the signal under measurement into an analytic signal.

In addition, it is desirable that the step of obtaining a jitter is a step of obtaining a difference between the maximum value and the minimum value of the timing jitter sequence to calculate a peak-to-peak value.

Alternatively, it is desirable that the step of obtaining a jitter is a step of obtaining a root mean square value of the timing jitter sequence to calculate an RMS value.

Or, it is desirable that the step of obtaining a jitter is a step of obtaining a histogram data of the timing jitter sequence.

Or, it is desirable that the step of obtaining a jitter is a step of obtaining a difference between the maximum value and the minimum value of the period jitter sequence to calculate a peak-to-peak value.

Or, it is desirable that the step of obtaining a jitter is a step of obtaining a root mean square value of the period jitter sequence to calculate an RMS value.

Or, it is desirable that the step of obtaining a jitter is a step of obtaining a histogram data of the period jitter sequence.

Or, it is desirable that the step of obtaining a jitter is a step of obtaining a difference between the maximum value and the minimum value of the cycle-to-cycle period jitter sequence to calculate a peak-to-peak value.

Or, it is desirable that the step of obtaining a jitter is a step of obtaining a root mean square value of the cycle-to-cycle period jitter sequence to calculate an RMS value.

Or, it is desirable that the step of obtaining a jitter is a step of obtaining a histogram data of the cycle-to-cycle period jitter sequence.

Or, it is desirable that a part or all of the peak-to-peak values, RMS values, and histogram data are obtained.

DETAILED DESCRIPTION OF THE INVENTION

The principles of the present invention will be described below. In the description, a clock signal is used as a signal under measurement.

Jitter Measurement Method

A jitter-free clock signal is a square wave having a fundamental frequency $f_0$. This signal can be resolved by Fourier analysis into harmonics comprising frequencies $f_0$, $3f_0$, $5f_0$, ⃛. Since a jitter corresponds to a fluctuation of a fundamental frequency of a signal under measurement, only signal components around the fundamental frequency are handled in a jitter analysis.

When a jitter is added to a clock signal, a fundamental sinusoidal wave component having an amplitude value A and a frequency $f_0$ can be expressed by an equation (1).

$$A \cos(\phi(t)) = A \cos(2\pi f_0 t + \theta - \Delta\phi(t)) \quad (1)$$

That is, an instantaneous phase function $\phi(t)$ can be expressed by a sum of a linear instantaneous phase component $2\pi f_0 t$ containing a fundamental frequency $f_0$, an initial phase component $\theta$ (can be assumed to be zero in a calculation), and a phase modulation component $\Delta\phi(t)$.

When a phase modulation component $\Delta\phi(t)$ is zero, an interval between adjacent rising zero-crossing points of the signal under measurement is a constant period $T_0$. The $\Delta\phi(t)$ that is not zero fluctuates the zero-crossing points of the signal under measurement. That is, $\Delta\phi(nT)$ represents a time fluctuation of a zero-crossing point T, and is called a timing jitter. A period jitter corresponds to a difference between timing jitters at adjacent rising zero-crossing points. Moreover, a cycle-to-cycle period jitter is a fluctuation between adjacent periods, and can be obtained as a difference between adjacent period jitter values.

Therefore, by estimating an instantaneous phase $\phi(t)$ of a signal under measurement and by obtaining a difference between the instantaneous phase and a linear phase (corresponds to a phase waveform of a jitter-free clock signal) $2\pi f_0 t + \theta$ at a zero-crossing point, a timing jitter, a period jitter, and a cycle-to-cycle period jitter of the signal under measurement can be calculated.

In addition, by estimating a timing of a zero-crossing point using the interpolation method with a small error, the measurement errors of a timing jitter, a period jitter, and a cycle-to-cycle period jitter can be reduced.

Figure 1:
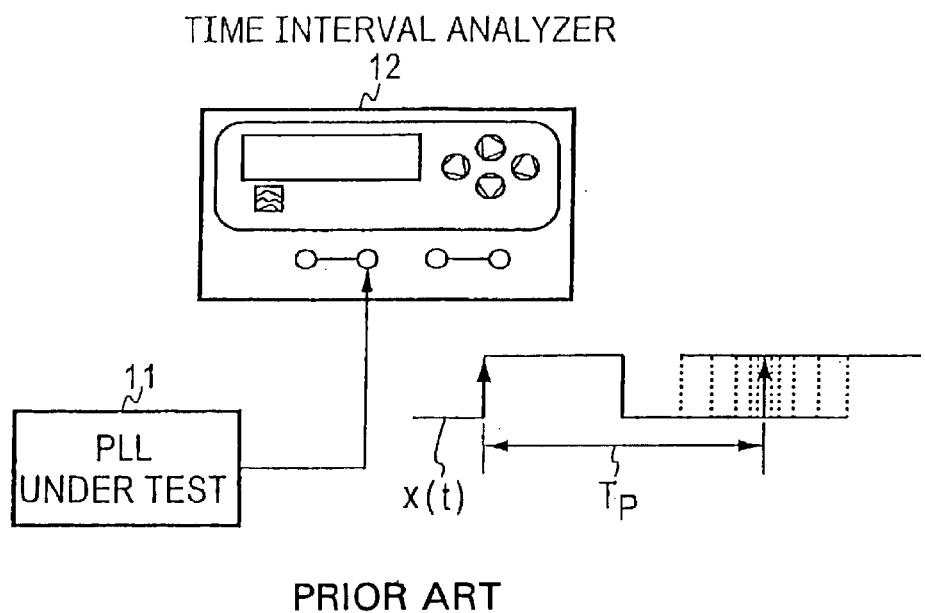
FIG. 1 is a diagram showing a jitter measurement setup using a time interval analyzer.
Figure 2:
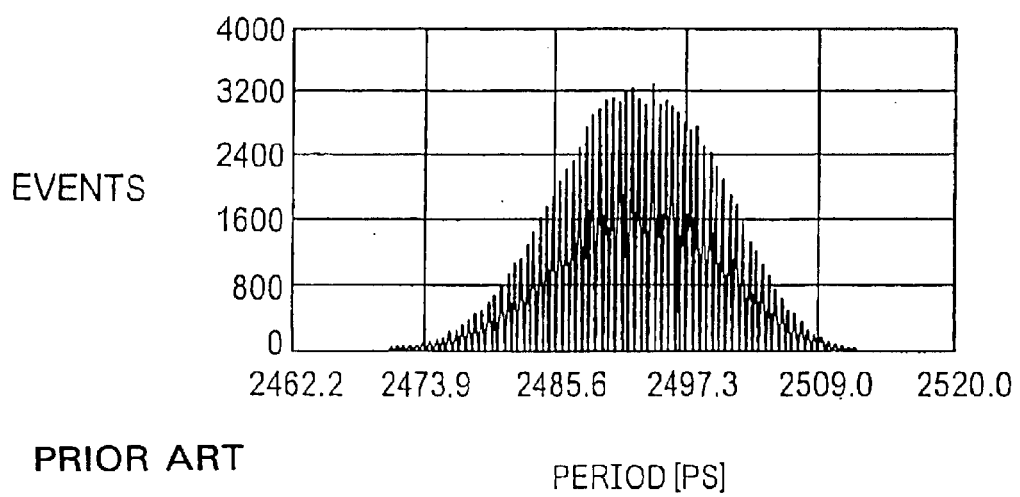
FIG. 2 is a diagram showing an example of a histogram of period jitters measured by the time interval analyzer.
Figure 3:
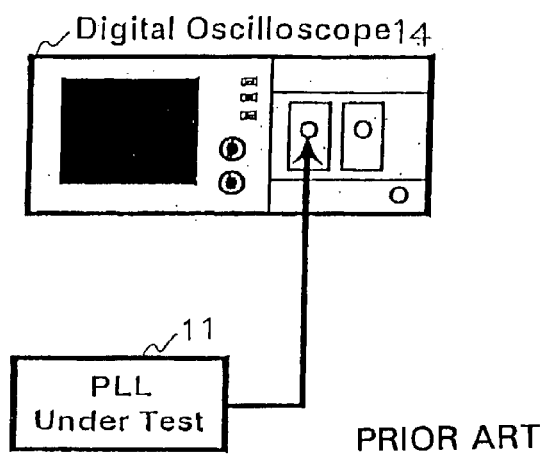
FIG. 3 is a diagram showing a jitter measurement setup using an interpolation-based jitter measurement method (oscilloscope).
Figure 4:
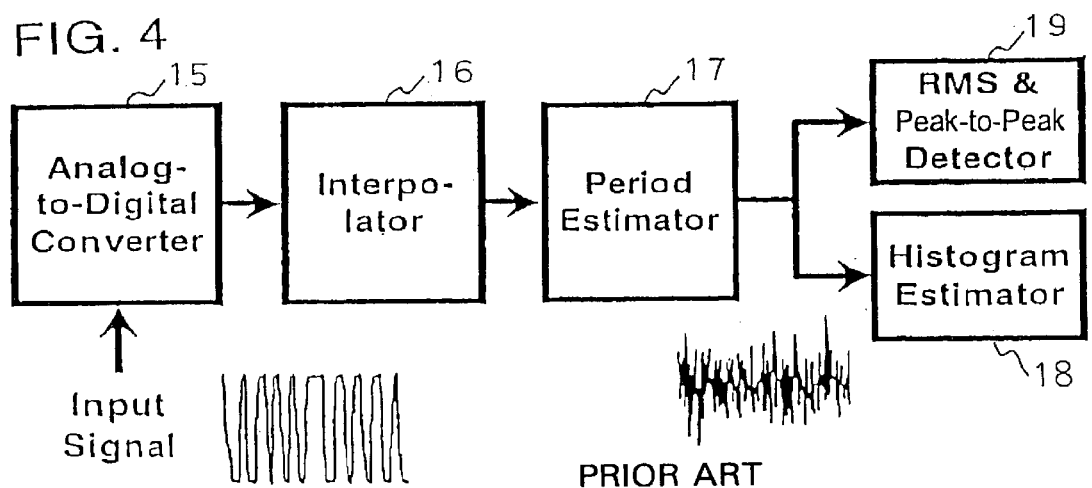
FIG. 4 is a block diagram showing a functional structure of jitter measurement using the interpolation-based jitter measurement method shown in FIG. 3.
Figure 5A:
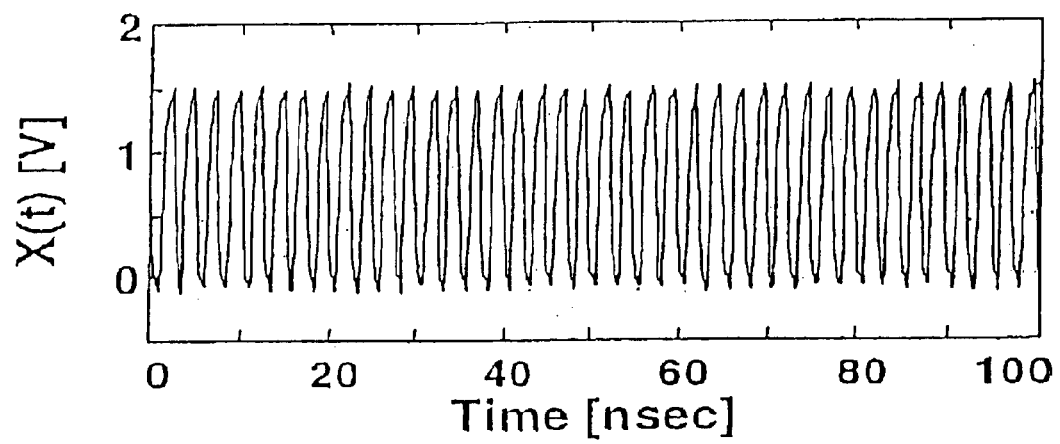
FIG. 5A is a diagram showing a waveform example of a signal under measurement.
Figure 5B:
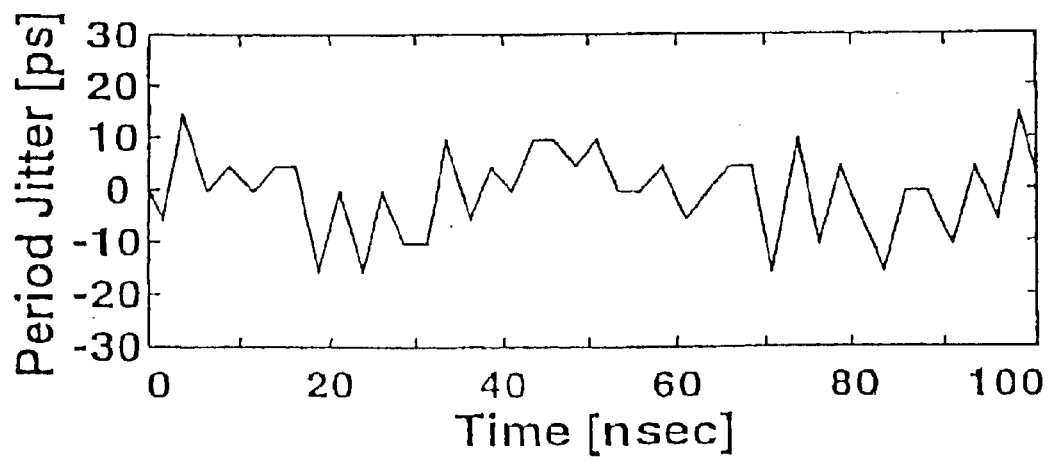
FIG. 5B is a diagram showing a waveform example of measured period jitters.
Figure 6:
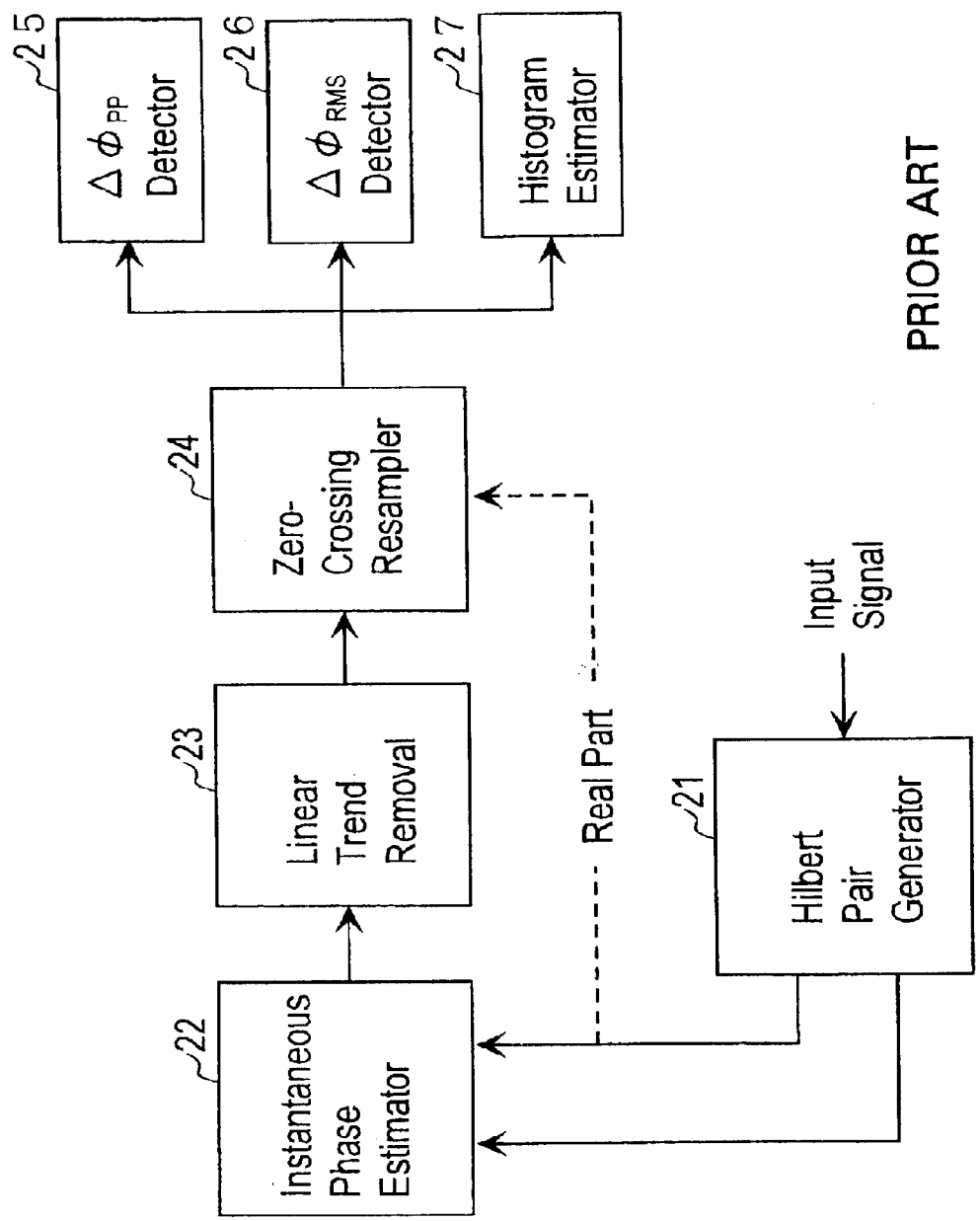
FIG. 6 is a block diagram showing a processing procedure of a conventional $\Delta\phi$ method.
Figure 7A:
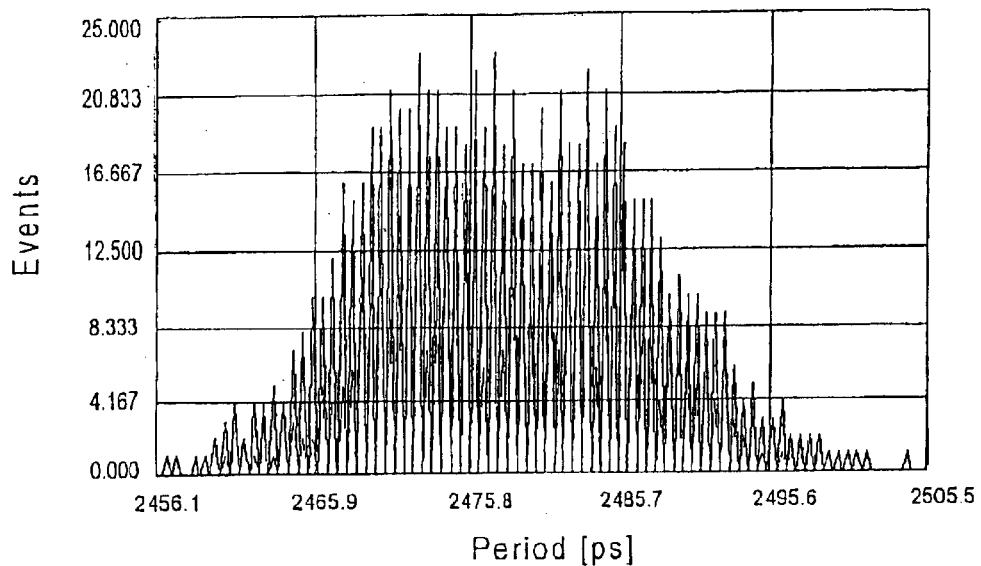
FIG. 7A is a diagram showing an example of measured result of jitters measured by the conventional time interval analyzer.
Figure 7B:
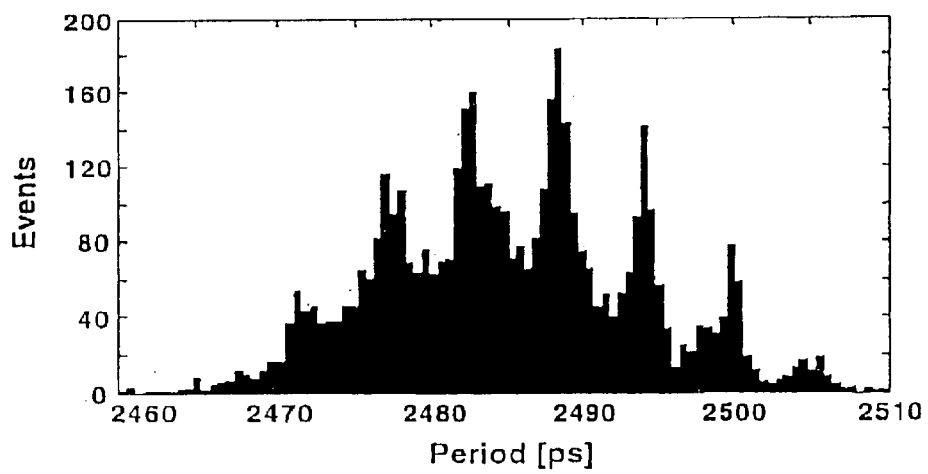
FIG. 7B is a diagram showing an example of measured result of jitters measured by the conventional interpolation-based jitter measurement method.
Figure 8:
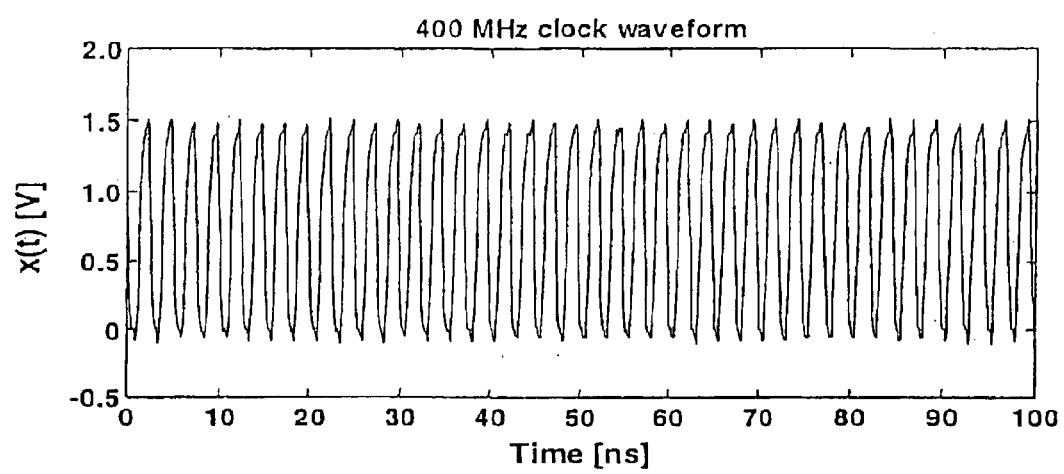
FIG. 8 is a diagram showing a waveform example of a clock signal under measurement
Figure 9:
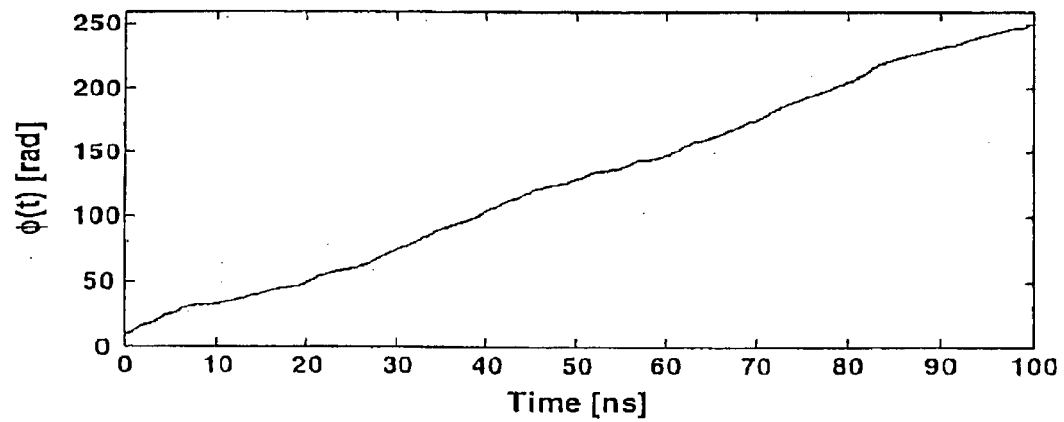
FIG. 9 is a diagram showing an example of an instantaneous phase waveform of a clock signal under measurement.
Figure 10:
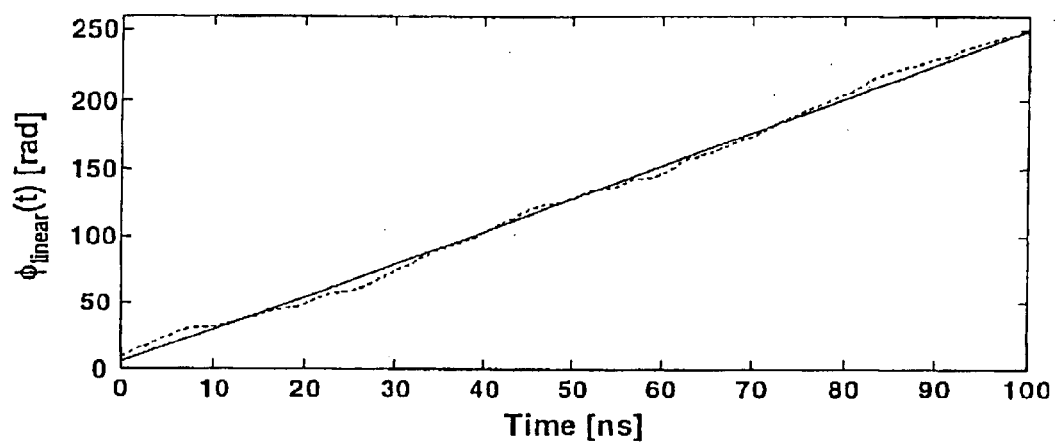
FIG. 10 is a diagram showing an example or a linear instantaneous phase waveform of a clock signal under measurement.

In the jitter measurement method according to the present invention, an instantaneous phase $\phi(t)$ of a signal under measurement x(t) shown in FIG. 8 is first estimated. FIG. 9 shows a waveform of the estimated instantaneous phase $\phi(t)$. Next, a linear fitting based on the least squares method is applied to the instantaneous phase waveform data to obtain a linear instantaneous phase $\phi_{linear}(t)$ of the instantaneous phase waveform data. This linear instantaneous phase $\phi_{liner}(t)$ corresponds to an instantaneous phase waveform of a jitter-free ideal signal. FIG. 10 shows the obtained linear instantaneous phase $\phi_{liner}(t)$. Next, a timing when the linear instantaneous phase $\phi_{liner}(t)$ of the signal under measurement becomes $\pi/2 + 2n\pi$ or $3\pi/2 + 2n\pi$ (n=0, 1, 2, ⃛) is estimated using the interpolation method or the inverse interpolation method, and then a difference between an instantaneous phase value and a linear phase at the zero-crossing timing, i.e., a timing jitter $\Delta\phi[n]$ (=$\Delta\phi(nT)$) is measured.

Figure 11:
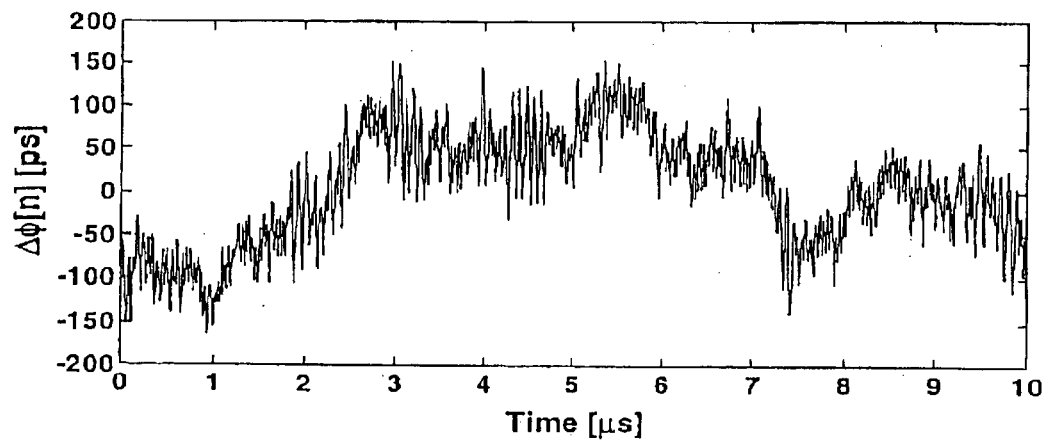
FIG. 11 is a diagram showing an example of a timing jitter waveform of a clock signal under measurement.

Here, a timing point when the linear instantaneous phase $\phi$liner(t) of the signal under measurement becomes $\pi/2 + 2n\pi$ corresponds to a falling zero-crossing point of the signal under measurement, and a timing point when the linear instantaneous phase $\phi_{linear}(t)$ of the signal under measurement becomes $3\pi/2 + 2n\pi$ corresponds to a rising zero-crossing point of the signal under measurement. FIG. 11 shows the measured timing jitter waveform $\Delta\phi[n]$. Finally an RMS value and a peak-to-peak value of timing jitters are measured from the timing jitter sequence $\Delta\phi+[n]$. An RMS timing jitter $\Delta\phi_{RMS}$ is a root-mean-square value of the timing jitter $\Delta\phi[n]$, and is expressed by an equation (2).

$$\Delta\phi_{\text{RMS}} = \sqrt{(1/N)\sum_{k=1}^{N} \Delta\phi^2[k]} \quad (2)$$

In this case, N is the number of samples of measured timing jitter data. In addition, a peak-to-peak timing jitter $\Delta\phi_{PP}$ is a difference between the maximum value and the minimum value of $\Delta\phi[n]$, and is expressed by an equation (3).

$$\Delta\phi_{PP} = \max_k(\Delta\phi[k]) - \min_k(\Delta\phi[k]) \quad (3)$$

Figure 12:
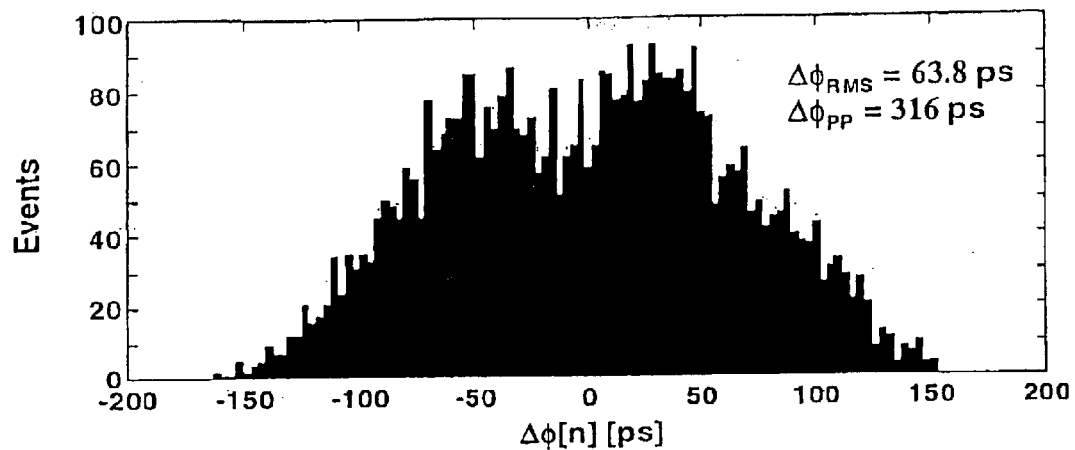
FIG. 12 is a diagram showing an example of a histogram of timing jitters measured by the jitter measurement method according to the present invention.

FIG. 12 shows a histogram of timing jitters and the measured values of $\Delta\phi_{RMS}$ and $\Delta\phi_{PP}$ measured by the jitter measurement method according to the present invention.

In addition, in this jitter measurement method according to the present invention, a period jitter can simultaneously be measured with a timing jitter. A period jitter J is a relative fluctuation of a period T to a fundamental period $T_0$, and is obtained as a difference between timing jitter values at adjacent two zero-crossing points. A period jitter J[k] is expressed by an equation (4).

$$J[k]=T[k]-T_0=\Delta\phi[k+m]-\Delta\phi[k] \qquad (4)$$

Figure 13:
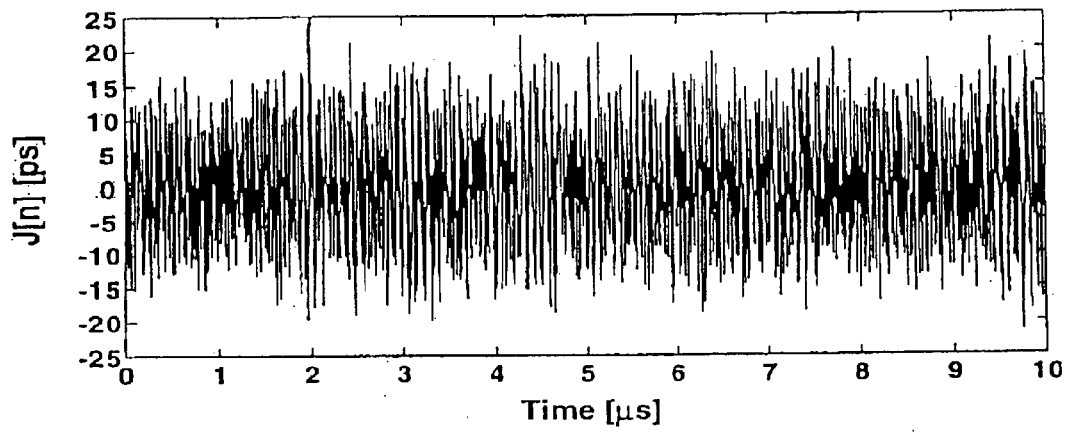
FIG. 13 is a diagram showing an example of a period jitter waveform of a clock signal under measurement

In this case, a period for obtaining a period jitter may be m periods (m=0.5, 1, 2, 3, ...). For example, by taking the m=0.5 period, a difference between two timing jitter values at a rising (or falling) zero-crossing point and a next falling (or rising) zero-crossing point may be obtained. Also, by taking the m=2 periods, a difference between two timing jitter values at a rising (or falling) zero-crossing point and a rising (or falling) zero-crossing point after two rising (or falling) points from the first rising (or falling) zero-crossing points may be obtained. FIG. 13 shows a period jitter J[n] obtained by taking m=1 period. In addition, by calculating a root-mean-square and a difference between the maximum value and the minimum value of the period jitter data measured in this manner, an RMS value $J_{RMS}$ and a peak-to-peak value $J_{PP}$ of the period jitter can be obtained by equations (5) and (6), respectively.

$$J_{\text{RMS}} = \sqrt{\left((1/M)\sum_{k=1}^{M} J^2[k]\right)} \qquad (5)$$

In this case, M is the number of samples of the measured period jitter data.

Figure 14A:
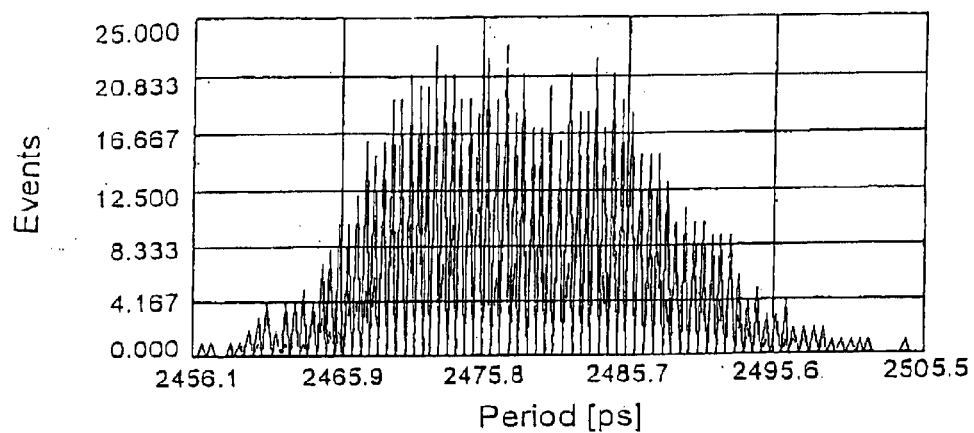
FIG. 14A is a diagram showing an example of a histogram of period jitters measured by the time interval analyzer.
Figure 14B:
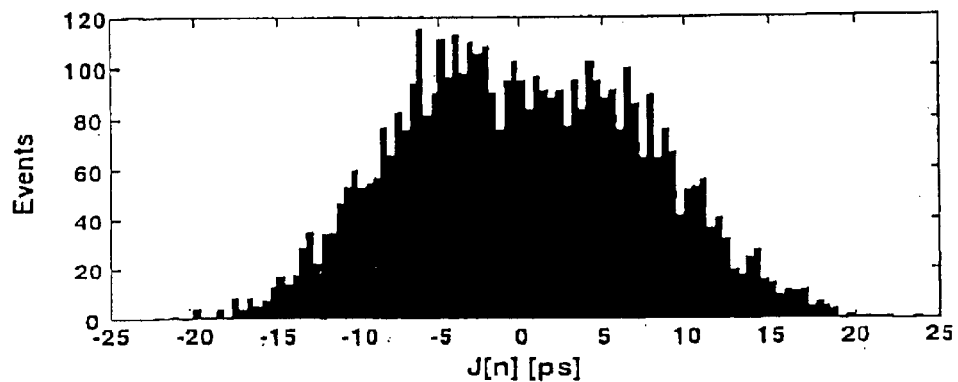
FIG. 14B is a diagram showing an example of a histogram of period jitters measured by the method.
Figure 14C:
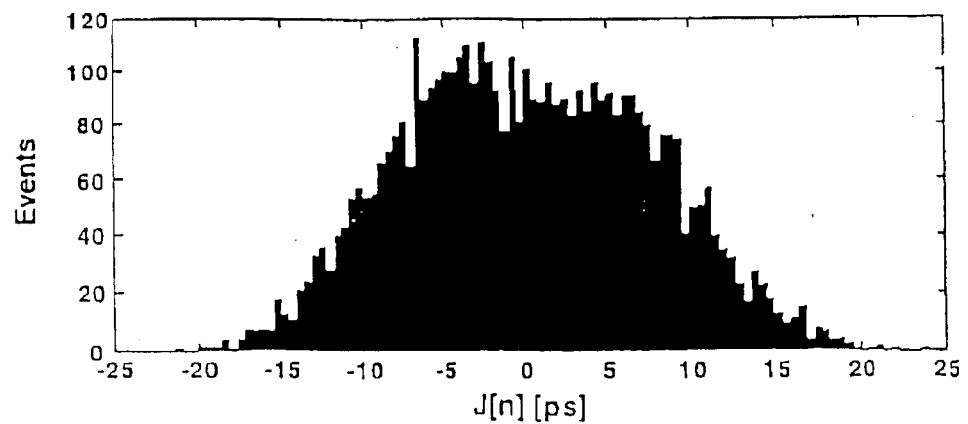
FIG. 14C is a diagram showing an example of a histogram of period jitters measured by the jitter measurement method according to the present invention.
Figures 15, 16:
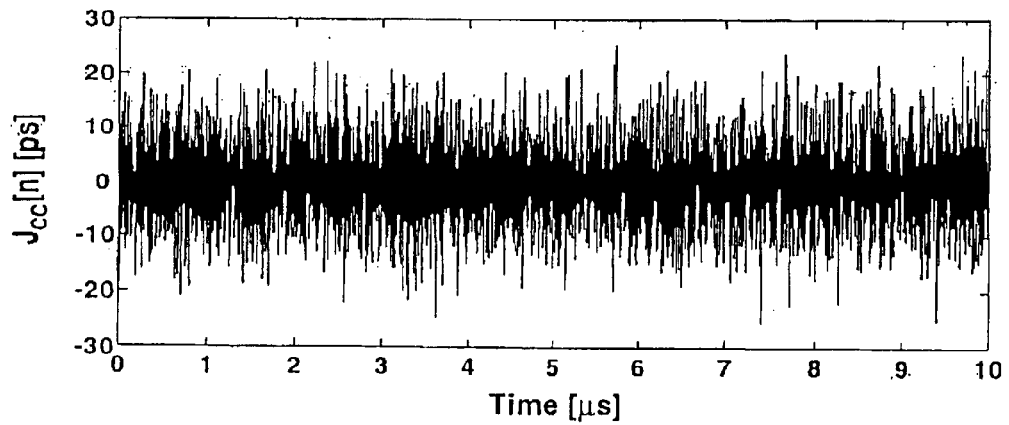
FIG. 15 is a diagram for comparing, with each other, period jitter values respectively measured by the time interval analyzer, the $\Delta\phi$ method, and the jitter measurement method according to the present invention.
FIG. 16 is a diagram showing an example of a cycle-to-cycle period jitter waveform of a clock signal under measurement.

FIG. 14 shows a histogram (FIG. 14C) of the period jitters measured by the jitter measurement method according to the present invention, a histogram (14A) measured by the conventional time interval analyzer, and a histogram (14B) measured by the $\Delta\phi$ method so that the histogram of the present invention can be compared with the histograms of the conventional time interval analyzer and the $\Delta\phi$ method. The 0 point on the lateral axis in each of FIGS. 14B and 14C corresponds to a period of approximately 2485 (ps), and FIGS. 14B and 14C show difference values obtained by the equation (4) based on the period of approximately 2485 (ps) as a reference value. It can be seen that the histogram of FIG. 14C looks like the histogram of FIG. 14A. In addition, FIG. 15 shows an RMS value and a peak-to-peak value of the period jitter measured by the jitter measurement method according to the present invention so that these values of the present invention can be compared with the corresponding values measured by the time interval analyzer and the $\Delta\phi$ method, respectively. Here, the peak-to-peak value $J_{PP}$ of the observed period jitter is substantially proportional to a square root of logarithm of the number of events (the number of zero-crossings). For example, in the case of approximately 5000 events, $J_{PP}=45$ ps is a correct value. A $J_{PP}$ error in FIG. 15 is shown assuming that 45 ps is the correct value. As shown in FIG. 15, the measured values in the method of the present invention correspond to −3.1% in $J_{RMS}$, and +1.0% in $J_{PP}$ of the respective values measured by the time analyzer, and it can be seen that respective differences are small. As shown in FIGS. 14A, 14B, 14C and 15, the jitter measurement method according to the present invention can obtain measured jitter values compatible with the measurement method by the conventional time interval analyzer by which correct measured values can be obtained.

Furthermore, the jitter measurement method according to the present invention can measure a cycle-to-cycle period jitter at the same time with a period jitter. A cycle-to-cycle period jitter $J_{CC}$ is a period fluctuation between contiguous cycles, and is expressed by an equation (7).

$$\begin{aligned} J_{CC}[k] &= T[k+1] - T[k] \\ &= (T_0 + J[k+1]) - (T_0 + J[k]) \\ &= J[k+1] - J[k] \end{aligned} \qquad (7)$$

Therefore, by obtaining differentials between the period jitter data measured by the method of the present invention described above to calculate their root-mean-square and a difference between the maximum value and the minimum value, an RMS value $J_{CC,RMS}$ and a peak-to-peak value $J_{CC,PP}$ of cycle-to-cycle period jitter can be obtained by equations (8) and (9), respectively.

$$J_{CC,\text{RMS}} = \sqrt{\left((1/L)\sum_{k=1}^{L} J_{CC}^2[k]\right)} \qquad (8)$$

$$J_{CC,PP}=\max_k(J_{CC}[k])-\min_k(J_{CC}[k]) \qquad (9)$$

Figure 17:
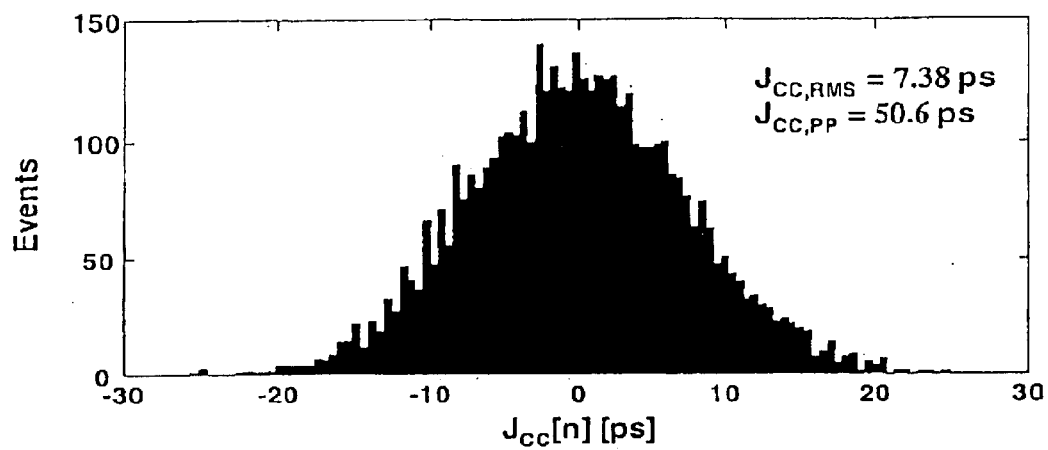
FIG. 17 is a diagram showing an example of a histogram of cycle-to-cycle period jitters measured by the jitter measurement method according to the present invention.

In this case, L is the number of samples of the measured cycle-to-cycle period jitter data. FIGS. 16 and 17 show a waveform and a histogram of the obtained cycle-to-cycle period jitter $J_{CC}$[n], respectively.

In the jitter measurement method according to the present invention, in addition to interpolating, as described above, linear instantaneous phase data to estimate a zero-crossing timing, instantaneous phase data may alternatively be interpolated to estimate a zero-crossing timing or real part data (correspond to a real signal) of an analytic signal may alternatively be interpolated to estimate a zero-crossing timing.

In addition, in the jitter measurement method according to the present invention, a period jitter can be estimated with high accuracy by removing, by waveform clipping means, amplitude modulation (AM) components of a signal under measurement to retain only phase modulation (PM) components corresponding to a jitter.

Instantaneous Phase Estimation Method Using an Analytic Signal

An analytic signal z(t) of a real signal x(t) is defined by a complex signal expressed by the following equation (10).

$$z(t) \equiv x(t)+jx'(t) \qquad (10)$$

In this case, j represents an imaginary unit, and an imaginary part x'(t) of the complex signal z(t) is a Hilbert transformation of a real part x(t).

On the other hand, Hilbert transformation of a time function x(t) is defined by the following equation (11).

$$x'(t) = H[x(t)] = \frac{1}{\pi}\int_{-\infty}^{+\infty} \frac{x(\tau)}{t-\tau} d\tau \qquad (11)$$

In this case, x'(t) is a convolution of the function x(t) and $(1/\pi t)$. That is, Hilbert transformation is equivalent to an output at the time when the x(t) is passed through an entire-band-pass filter. However, the output x'(t) in this case has not been changed in terms of its spectrum components, but its phase has been shifted by $\pi/2$.

Analytic signal and Hilbert transformation are described in, for example, "Probability, Random Variables, and Stochastic Processes" by A. Papoulis, 2nd edition, McGraw-Hill Book Company, 1984.

An instantaneous phase waveform $\phi(t)$ of a real signal $x(t)$ can be obtained from an analytic signal $z(t)$ using following equation (12).

$$\phi(t)=\tan^{-1}[x'(t)/x(t)] \quad (12)$$

Figure 18:
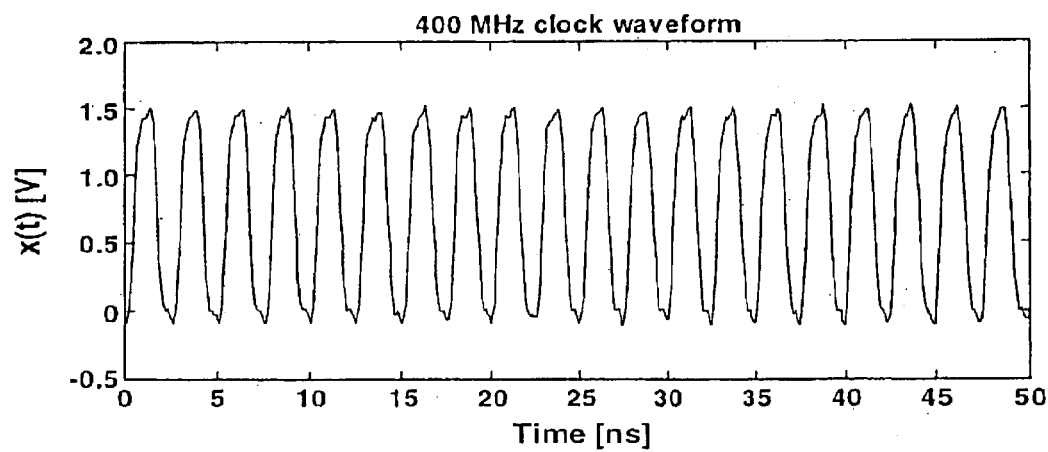
FIG. 18 is a diagram showing an example of a clock signal under measurement.
Figure 19:
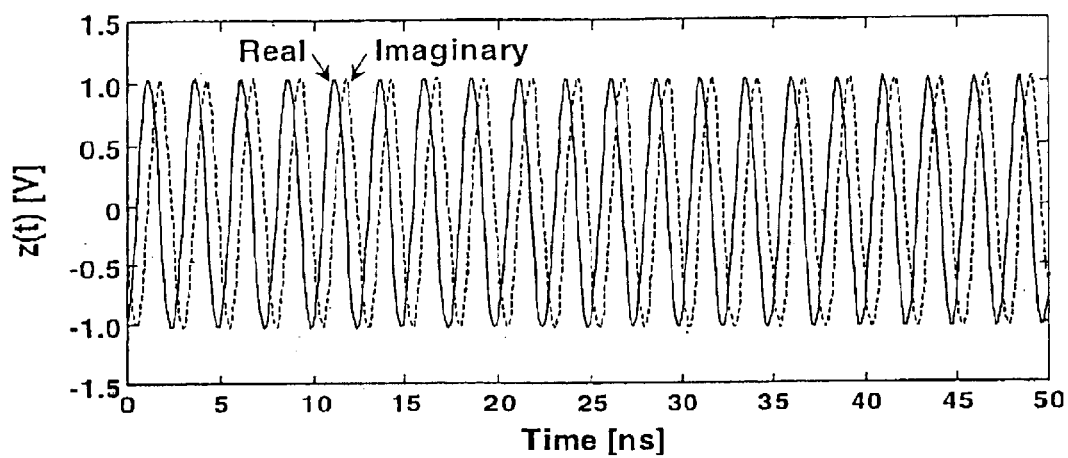
FIG. 19 is a diagram showing an example of a transformed complex analytic signal.
Figure 20:
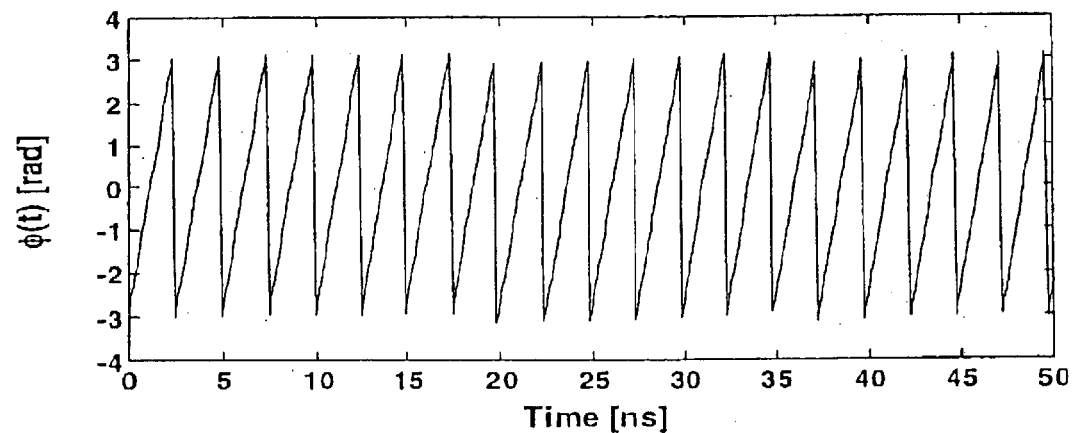
FIG. 20 is a diagram showing an example of an instantaneous phase signal having discontinuity points.
Figure 21:
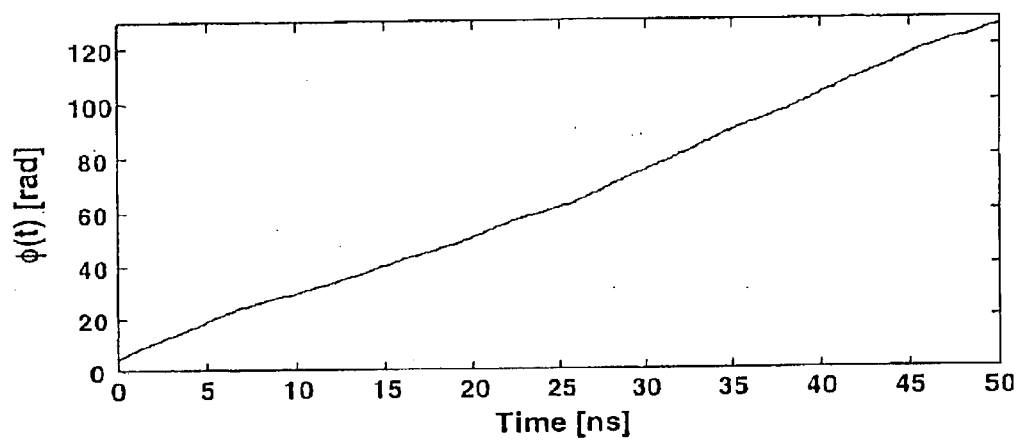
FIG. 21 is a diagram showing an example of an unwrapped continuous instantaneous phase signal.

Next, an algorithm for estimating an instantaneous phase using Hilbert transformation will be described. First, a signal under measurement $x(t)$ is transformed into an analytic signal $z(t)$ by applying Hilbert transformation to the signal under measurement $x(t)$ shown in FIG. 18 to obtain a signal $x'(t)$ corresponding to an imaginary part of the complex signal. FIG. 19 shows a transformed analytic signal. A real part $x(t)$ is indicated by a solid line, and an imaginary part $x'(t)$ is indicated by a dashed line. Here, a band-pass filtering process has been applied to the obtained analytic signal. This is because a jitter corresponds to a fluctuation of a fundamental frequency of a signal under measurement and hence only signal components around a fundamental frequency are handled in a jitter analysis. Next, an instantaneous phase function $\phi(t)$ is estimated from the obtained analytic signal using the equation (12). Here, $\phi(t)$ is expressed using principal values of phase in the range of $-\pi$ to $+\pi$, and has a discontinuity point at the proximity of a point where the phase changes from $+\pi$ to $-\pi$. FIG. 20 shows the estimated phase function $\phi(t)$. Finally, by unwrapping (that is, an integer multiple of $2\pi$ is appropriately added to a main value $\phi(t)$) the discontinuous phase function $\phi(t)$, a continuous instantaneous phase function $\phi(t)$ from which discontinuity has been removed can be obtained. FIG. 21 shows an unwrapped continuous instantaneous phase function $\phi(t)$.

Transformation to an Analytic Signal Using Fourier Transformation

A transformation from a real signal to an analytic signal can be realized by a digital signal processing using Fast Fourier Transformation.

Figure 22:
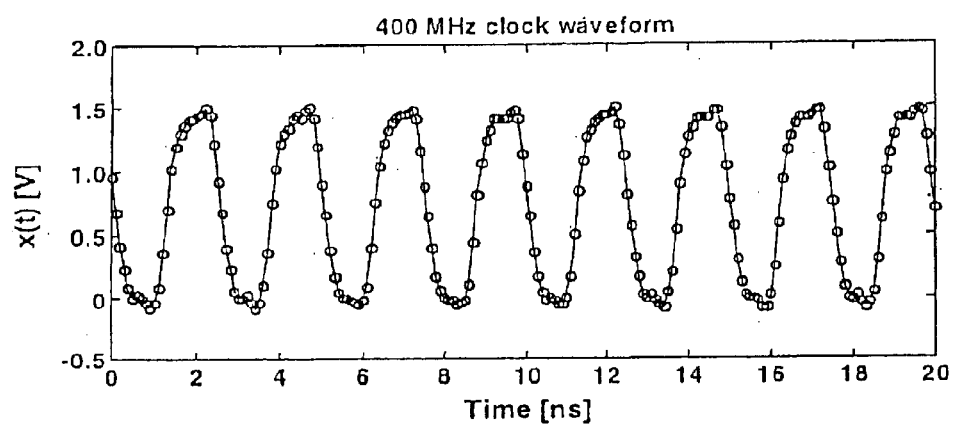
FIG. 22 is a diagram showing an example of a digitized signal under measurement
Figure 23:
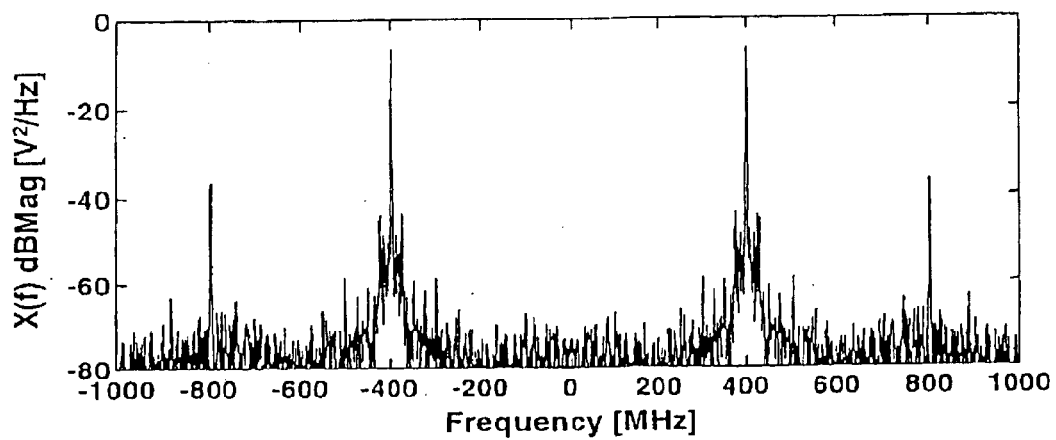
FIG. 23 is a diagram showing an example of a both-sided power spectrum of a signal under measurement obtained by FFT.
Figure 24:
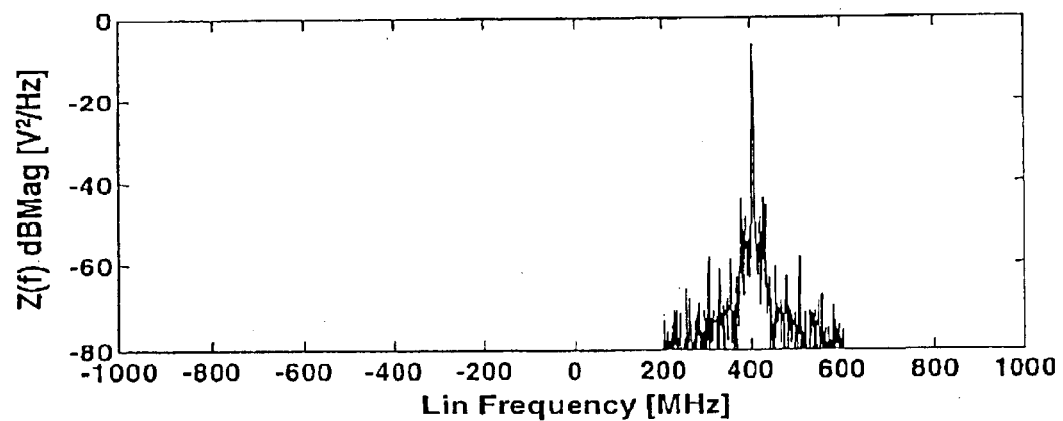
FIG. 24 is a diagram showing an example of a band-limited single-sided power spectrum.
Figure 25:
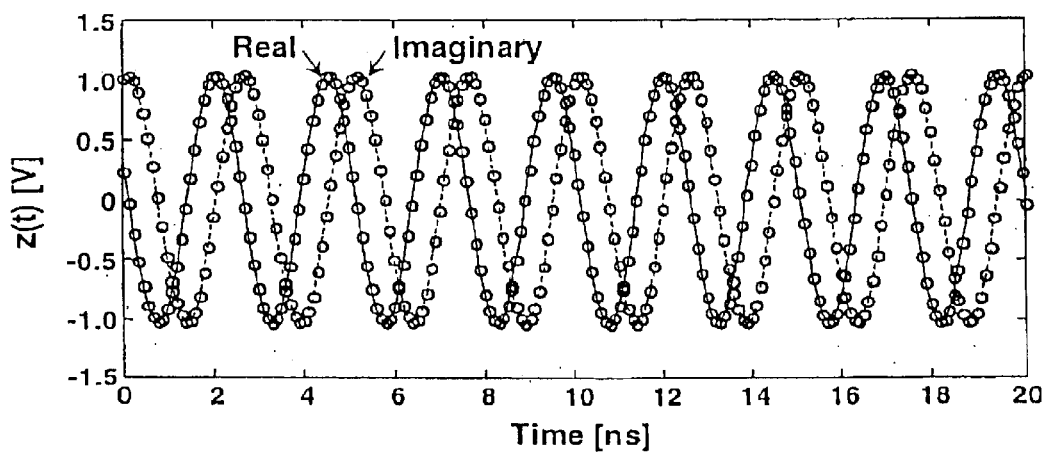
FIG. 25 is a diagram showing an example of a band-limited analytic signal obtained using inverse FFT.

First, FFT is applied to, for example, a digitized signal under measurement $x(t)$ (400 MHz clock) shown in FIG. 22 to obtain a both-sided spectrum (having positive and negative frequencies) $X(f)$. FIG. 23 shows the obtained both-sided spectrum $X(f)$. Next, data around the fundamental frequency 400 MHz in the positive frequency components of the spectrum $X(f)$ are retained, and the remaining data are made zero. In addition, the positive frequency components are doubled. These processes in frequency domain correspond to limiting bandwidth of the signal under measurement and transforming the signal under measurement into an analytic signal in time domain. FIG. 24 shows the obtained signal $Z(f)$ in frequency domain. Finally, by applying inverse FFT to the obtained signal $Z(f)$, a band-limited analytic signal $z(t)$ can be obtained. FIG. 25 shows the band-limited analytic signal $z(t)$.

Transformation to an analytic signal using FFT is described in, for example, "Random Data: Analysis and Measurement Procedure" by J. S. Bendat and A. G. Piersol, 2nd edition, John Wiley & Sons, Inc., 1986.

Estimation of Linear Instantaneous Phase Function by Least Squared Method

A linear instantaneous phase can be estimated by applying linear fitting based on least squares method to an unwrapped instantaneous phase data.

The least squares method is a fitting method in which a square value of length of a plumb line (a linear line drawn downwardly in parallel with a longitudinal line) from a data point to a linear line is utilized as a yardstick of magnitude of fluctuation. In general, when n two-dimensional data $(x_1, y_1), (x_2, y_2), \ldots (x_n, y_n)$ are given, if a least mean square line for these data is assumed to be expressed by an equation (13), $$Y=a+bx \quad (13)$$

a square value of length of a plumb line from a data $(x_1, y_1)$ ($i=1, 2, \ldots, n$) to a least mean square line is given by $\{y_i-(a+bx)\}^2$. At this time, by expressing a sum of square values of plumb line lengths by equation (14), $$\sum_{i=1}^{n} \{y_i - (a+bx_i)\}^2 = na^2 - 2a\left(\sum y_i - b\sum x_i\right) + b^2 \sum x_i^2 - \quad (14)$$

$$2b \sum x_i y_i + \sum y_i^2$$

$$= n\left\{a - \left(\frac{1}{n}\sum y_i - b\frac{1}{n}\sum x_i\right)\right\}^2 +$$

$$\left\{\sum y_i^2 - \frac{1}{n}\left(\sum x_i\right)^2\right\}$$

$$\left\{b - \frac{n\sum x_i y_i - \left(\sum x_i\right)\left(\sum y_i\right)}{n\sum x_i^2 - \left(\sum x_i\right)^2}\right\}^2 +$$

$$\left\{\sum y_i^2 - \sum x_i y_i + \frac{1}{n}\sum y_i \left[\sum x_i - \sum y_i\right]\right\}$$

coefficients b and a by which the sum of the square values becomes minimum can be obtained by equations (15) and (16), respectively.

$$b = \frac{n\sum x_i y_i - \left(\sum x_i\right)\left(\sum y_i\right)}{n\sum x_i^2 - \left(\sum x_i\right)^2} \quad (15)$$

$$a = \frac{1}{n}\left[\sum y_i - b\sum x_i\right] \quad (16)$$

As described above, a linear instantaneous phase function can be obtained from all instantaneous phase data using the equations (15) and (16).

Timing Estimation by Interpolation Method

When values of a function $y=f(x)$ are given for discontinuous values $x_1, x_2, x_3, \ldots, x_n$, of a variable x, "interpolation" is to estimate a value of $f(x)$ for a value of x other than $x_k$ ($k=1, 2, 3, \ldots, n$).

Figure 26:
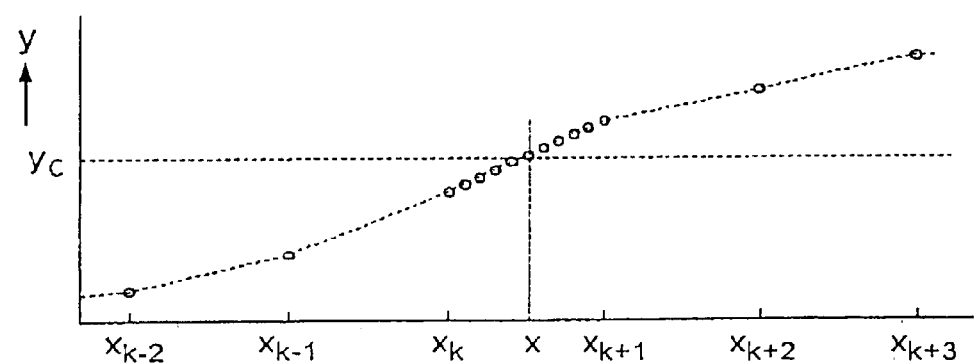
FIG. 26 is a diagram showing an example of a timing estimation using an interpolation method.

In the timing estimation using an interpolation method, for example as shown in FIG. 26, an interval between two measurement points $x_k$ and $x_k$+that contains a predetermined value $y_c$ is interpolated in sufficient detail. After that an interpolated data closest to the predetermined value $y_c$ is searched, whereby a timing x when a function value y becomes the predetermined value $y_c$ is estimated. A timing estimation error is proportional to a time width that equally divides a time length between two measurement points $x_k$ and $x_{k+1}$. That is, in order to decrease a timing estimation error, it is desirable that $y=f(x)$ is interpolated by dividing a time length between the two measurement points $x_k$ and $x_{k+1}$ into equal time widths and by making each time width as short as possible.

Polynomial Interpolation

First, an interpolation method using a polynomial will be described. Polynomial interpolation is described in, for example, "Numerical Analysis" by L. W. Johnson and R. D. Riess, Massachusetts: Addison-Wesley, pp. 207–230, 1982.

When two points $(x_1, y_1)$ and $(x_2, y_2)$ on a plane are given, a line $y=P_1(x)$ that passes through these two points is given by an equation (17), and is unitarily determined.

$$y=P_1(x)=\{(x_1-x_2)(x_1-x_2)\}y_1+\{(x-x_1)/(x_2-x_1)\}y_2 \qquad (17)$$

Similarly, a quadratic curve $y=P_2(x)$ that passes through three points $(x_1, y_1)$, $(x_2, y_2)$ and $(x_3, y_3)$ on a plane is given by an equation (18).

$$y = P_2(x) = \frac{(x-x_2)(x-x_3)}{(x_1-x_2)(x_1-x_3)}y_1 + \frac{(x-x_1)(x-x_3)}{(x_2-x_1)(x_2-x_3)}y_2 + \frac{(x-x_1)(x-x_2)}{(x_3-x_1)(x_3-x_2)}y_3 \qquad (18)$$

In general, a curve of (N−1)th degree $y=P_{N-1}(x)$ that passes through N points $(x_1, y_1)$, $(x_1, y_2)$ III $(x_N, y_N)$ on a plane is unitarily determined, and is given by an equation (19) from the Lagrange's classical formula.

$$y = P_{N-1}(x) = \frac{(x-x_2)(x-x_3)\cdots(x-x_N)}{(x_1-x_2)(x_1-x_3)\cdots(x_1-x_N)}y_1 + \frac{(x-x_1)(x-x_3)\cdots(x-x_N)}{(x_2-x_1)(x_2-x_3)\cdots(x_2-x_N)}y_2 + \cdots + \frac{(x-x_1)(x-x_2)\cdots(x-x_{N-1})}{(x_N-x_1)(x_N-x_2)\cdots(x_N-x_{N-1})}y_N \qquad (19)$$

In the interpolation by polynomial of degree (N−1), a value of $y=f(x)$ for a desired x is estimated from N measurement points using the above equation (19). In order to obtain a better approximation of an interpolation curve $P_{N-1}(x)$, it is desirable to select N points in the proximity of x.

Cubic Spline Interpolation

Next, cubic spline interpolation will be described. Cubic spline interpolation is described in, for example, "Numerical Analysis" by L. W. Johnson and R. D. Riess, Massachusetts: Addison-Wesley, pp. 237–248, 1982.

"Spline" means an adjustable ruler (thin elastic rod) used in drafting. When a spline is bended such that the spline passes through predetermined points on a plane, a smooth curve (spline curve) concatenating those points is obtained. This spline curve is a curve that passes through the predetermined points, and has the minimum value of square integral (proportional to the transformation energy of spline) of its curvature.

When two points $(x_1, y_1)$ and $(x_2, y_2)$ on a plane are given, a spline curve that passes through these two points is given by an equation (20).

$$y=Ay_1+By_2+Cy_1''+Dy_2''$$

$$A\equiv(x_2-x)/(x_2-x_1)$$

$$B\equiv1-A=(x-x_1)/(x_2-x_1)$$

$$C\equiv(1/6)(A^3-A)(x_2-x_1)^2$$

$$D\equiv(1/6)(B^3-B)(x_2-x_1)^2 \qquad (20)$$

Here, $y_1''$ and $y_2''$ are the second derivative values of the function $y=f(x)$ at $(x_1, y_1)$ and $(x_2, y_2)$, respectively.

In the cubic spline interpolation, a value of $y=f(x)$ for a desired x is estimated from two measurement points and the second derivative values at the measurement points using the above equation (20). In order to obtain a better approximation of an interpolation curve, it is desirable to select two points in the proximity of x.

Timing Estimation by Inverse Linear Interpolation

Inverse interpolation is a method of conjecturing, when a value of a function $y_k=f(x_k)$ is given for a discontinuous value $x_1, x_2$, III, $x_n$ of a variable x, a value of $g(y)=x$ for an arbitrary y other than discontinuous $y_k$ (k=1, 2, III, n) by defining an inverse function of $y=f(x)$ to be $x=g(y)$. In the inverse linear interpolation, a linear interpolation is used in order to conjecture a value of x for y.

When two points $(x_1, y_1)$ and $(x_2, y_2)$ on a plane are given, a linear line that passes through these two points is given by an equation (21).

$$y=\{(x-x_2)/(x_{1-x2})\}y_1+\{(x-x_1)/(x_2-x_1)\}y_2 \qquad (21)$$

An inverse function of the above equation is given by an equation (22), and a value of x for y can unitarily be obtained.

$$x=\{(y-y_2)/(y_1-y_2)\}x_1+\{(y-y_1)/(y_2-y_1)\}x_2 \qquad (22)$$

Figure 27:
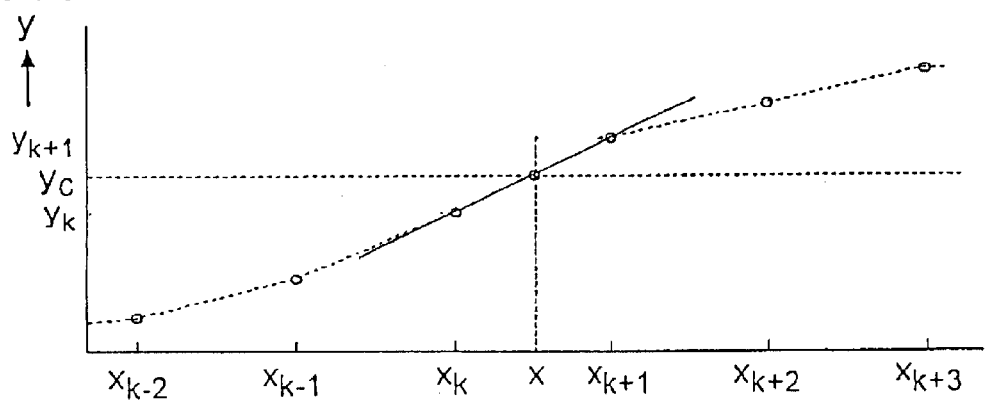
FIG. 27 is a diagram showing an example of a timing estimation using an inverse linear interpolation method.

In the inverse linear interpolation, as shown in FIG. 27, a value of $x=g(y_c)$ for a desired $y_c$ is estimated from two measurement points $(x_k, y_k)$ and $(x_k+1, y_{k+1})$ using the above equation (22), whereby a timing x for obtaining a predetermined value $y_c$ is unitarily be estimated. In order to reduce an estimation error, it is desirable to select two measurement points $x_k$ and $x_{k+1}$ between which x is contained.

Waveform Clipping

Figure 28A:
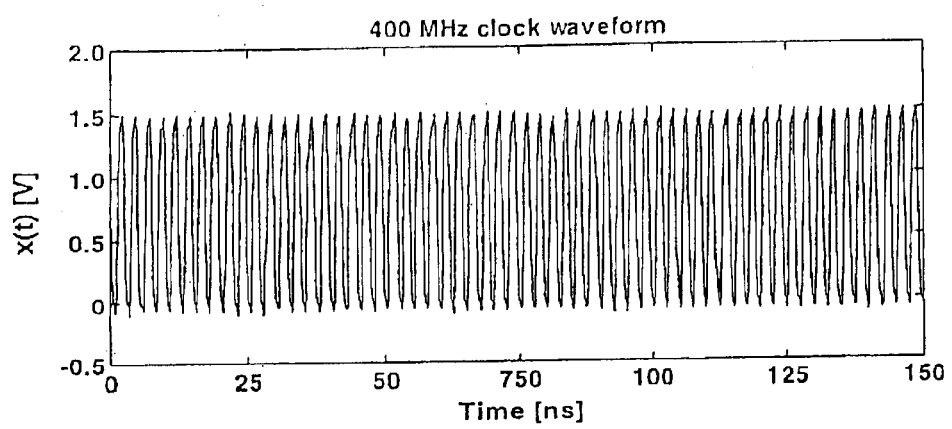
FIG. 28A is a diagram showing an example of a clock signal under measurement that contains AM components.
Figure 28B:
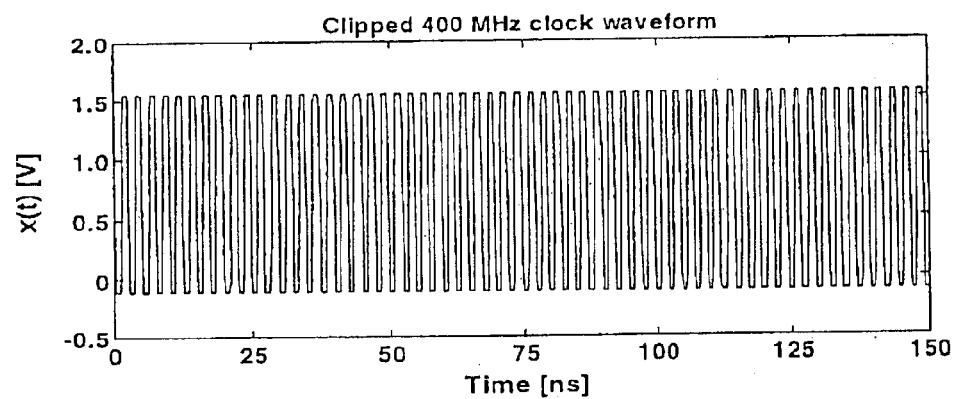
FIG. 28B is a diagram showing an example of a clock signal under measurement that does not contain AM components.

Waveform clipping means removes AM (amplitude modulation) components from an input signal, and retains only PM (phase modulation) components corresponding to a jitter. Waveform clipping is performed by applying the following processes to an analog input signal or a digital input signal; 1) multiplying the value of the signal by a constant, 2) replacing a signal value larger than a predetermined threshold 1 with the threshold 1, and 3) replacing a signal value smaller than a predetermined threshold 2 with the threshold 2. Here, it is assumed that the threshold 1 is larger than the threshold 2. FIG. 28A shows an example of a clock signal having AM components. Since the envelope of the time based waveform of this signal fluctuates, it is seen that this signal contains AM components. FIG. 28B shows a clock signal that is obtained by clipping the clock signal shown in FIG. 28A using clipping means. Since the time based waveform of this signal shows a constant envelope, it can be ascertained that the AM components have been removed.

DESCRIPTION OF A PREFERRED EMBODIMENT

An embodiment of the present invention will be described below.

Figure 29:
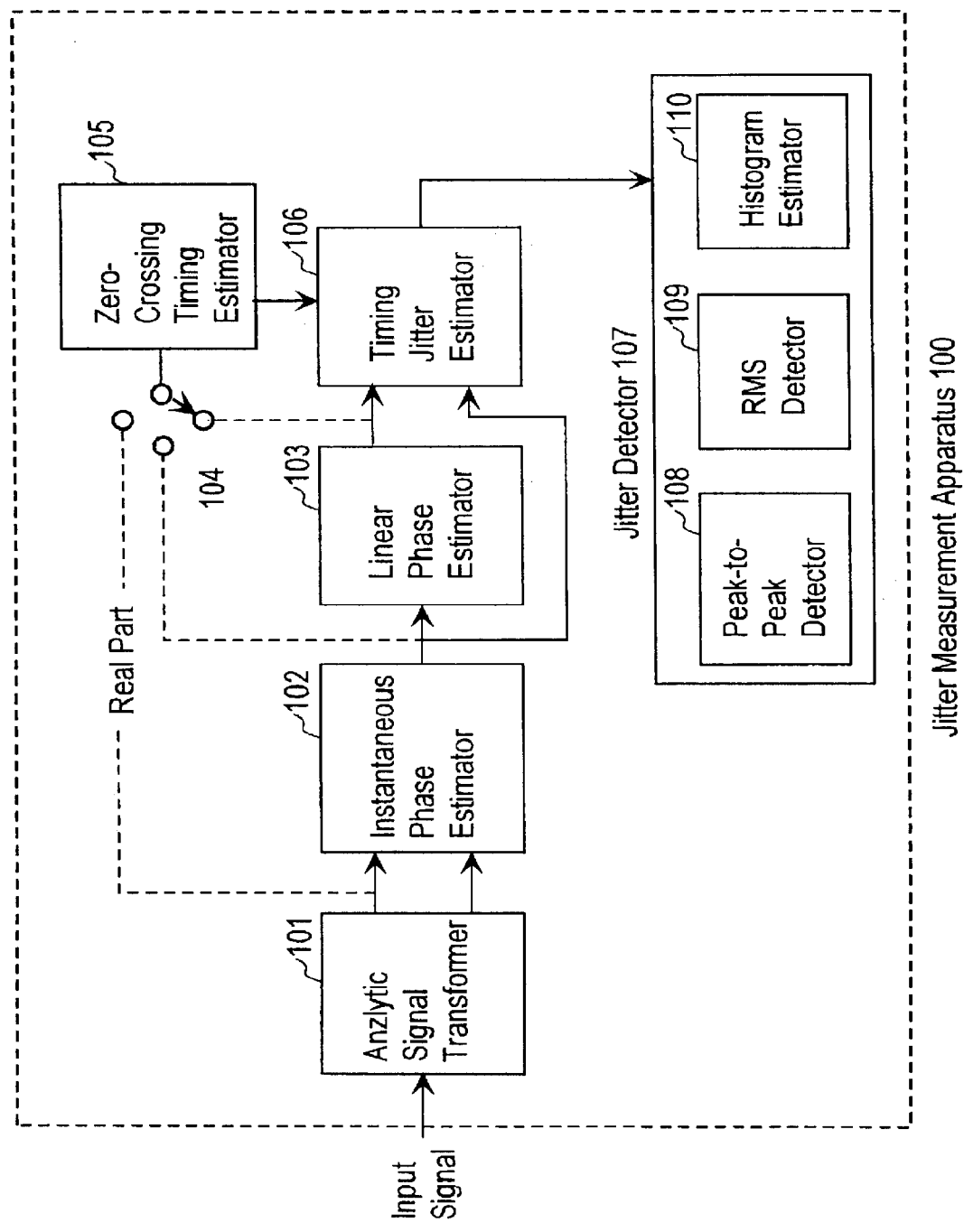
FIG. 29 is a diagram showing an example of a configuration of a jitter measurement apparatus according to the present invention.

FIG. 29 shows an example of a configuration of the jitter measurement apparatus used in the embodiment of the present invention. This jitter measurement apparatus 100 comprises analytic signal transformation means 101 for selectively passing therethrough a predetermined component of a signal under measurement (input signal) to transform it into a complex analytic signal, instantaneous phase estimation means 102 for estimating an instantaneous phase of the signal under measurement using the complex analytic signal obtained from the analytic signal transformation means 101, linear instantaneous phase estimation means 103 for estimating a linear instantaneous phase of the signal under measurement by obtaining a least mean square line of the estimated instantaneous phase data, a switch 104 for selecting the linear instantaneous phase estimated by the linear instantaneous phase estimation means 103, the instantaneous phase estimated by the instantaneous phase estimation means 102, or a real part of the complex analytic signal transformed by the analytic signal transformation means 101, zero-crossing timing estimation means 105 for estimating, by interpolation method or inverse interpolation method, a zero-crossing timing of the signal under measurement using the linear instantaneous phase, the instantaneous phase, or a real part of the complex analytic signal selected by the switch 104, timing jitter estimation means 106 for calculating a difference between the instantaneous phase value and the linear instantaneous phase value of the signal under measurement at the zero-crossing timing estimated by the zero-crossing timing estimation means 105 to estimate a timing jitter sequence, and jitter detection means 107 for obtaining a jitter of the signal under measurement from the timing jitter sequence. In addition, the jitter detection means 107 comprises peak-to-peak detection means 108 for obtaining a difference between the maximum value and the minimum value in the timing jitter sequence, RMS detection means 109 for obtaining a root-mean-square value (RMS value) of the timing jitter sequence, and histogram estimation means 110 for obtaining a histogram of the timing jitter sequence. Moreover, the analytic signal transformation means 101 can employ either one of the configurations to be described later. The jitter detection means 107 may be constituted by one or a plurality of the peak-to-peak detection means 108, the RMS detection means 109, and the histogram estimation means 110.

Figure 30:
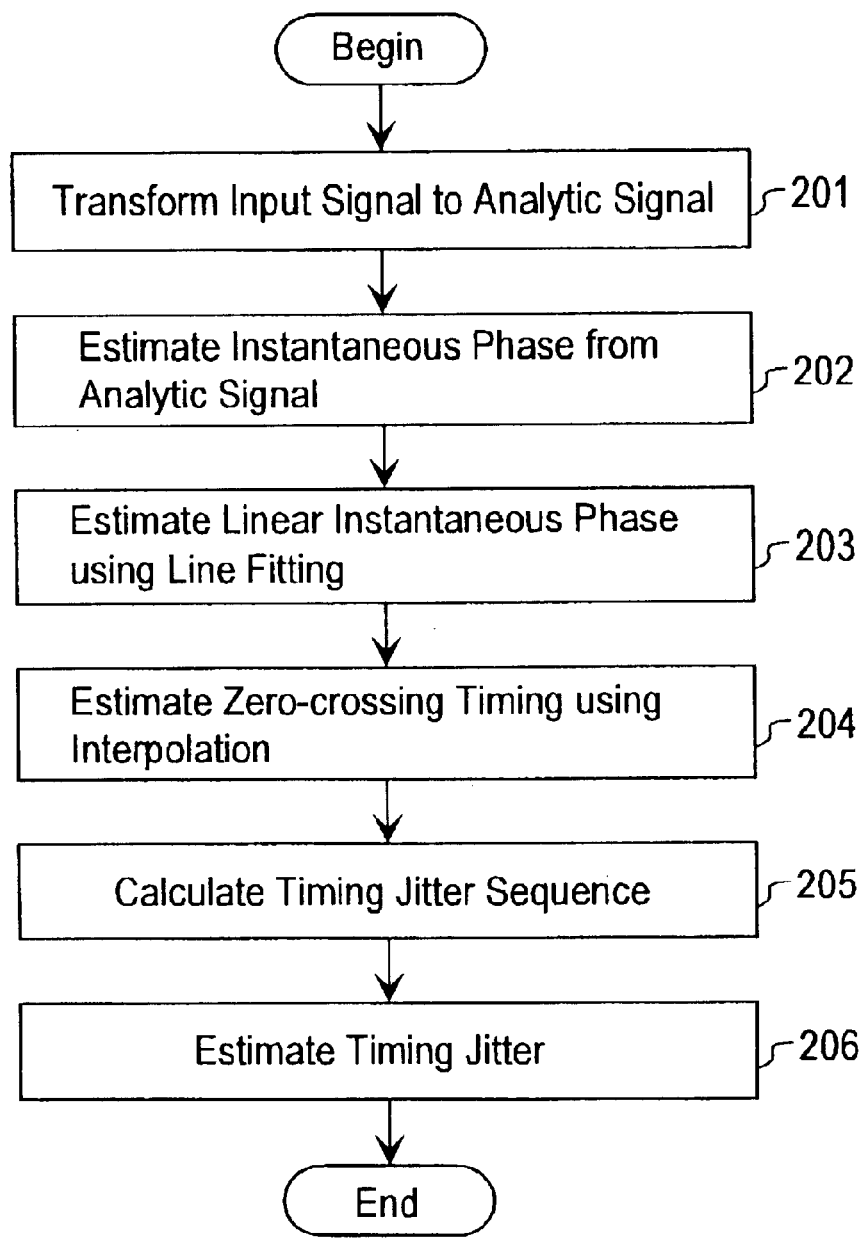
FIG. 30 is a flow-chart showing an example of a jitter measurement method according to the present invention.

Next, the operation in the case of performing a jitter measurement of a signal under measurement using the jitter measurement apparatus 100 according to the present invention will be described. FIG. 30 shows an example of a processing procedure of the jitter measurement method according to the present invention. First, in step 201, the analytic signal transformation means 101 selectively passes therethrough a predetermined frequency component of the signal under measurement to transform it into a complex analytic signal. Next, in step 202, an instantaneous phase of the signal under measurement is estimated by the instantaneous phase estimation means 102 using the complex analytic signal obtained from the analytic signal transformation means 101. Next, in step 203, the linear instantaneous phase estimation means 103 estimates a linear instantaneous phase of the signal under measurement by obtaining a least mean square line of the instantaneous phase data estimated by the instantaneous phase estimation means 102. Next, in step 204, the zero-crossing timing estimation means 105 estimates a zero-crossing timing of the signal under measurement using the interpolation method or the inverse interpolation method. Next, in step 205, the timing jitter estimation means 106 calculates a difference between an instantaneous phase value and a linear instantaneous phase value of the signal under measurement at the zero-crossing timing estimated by the zero-crossing timing estimation means 105 to estimate a timing jitter sequence. Finally, in step 206, the jitter detection means 107 obtains a timing jitter of the signal under measurement from the timing jitter sequence, and the process ends. In the step 206 for obtaining a timing jitter of the signal under measurement, the peak-to-peak detection means 108 obtains a peak-to-peak value of timing jitter using the equation (3), the RMS detection means 109 obtains an RMS value of timing jitter using the equation (2), and the histogram estimation means 110 obtains a histogram from the timing jitter sequence. In addition, in the step 204 for estimating a zero-crossing timing, a timing when the linear instantaneous phase becomes $\pi/2+2n\pi$ or $3\pi T/2+2n\pi$ (n=0, 1, 2, III) may be estimated using the interpolation method or the inverse interpolation method, a timing when the instantaneous phase becomes $\pi/2+2n\pi$ or $3\pi/2+2n\pi$ (n=0, 1, 2, II I) may be estimated using the interpolation method or the inverse interpolation method, or a timing when a real part of the analytic signal becomes zero-crossing may be estimated using the interpolation method or the inverse interpolation method.

Figure 31:
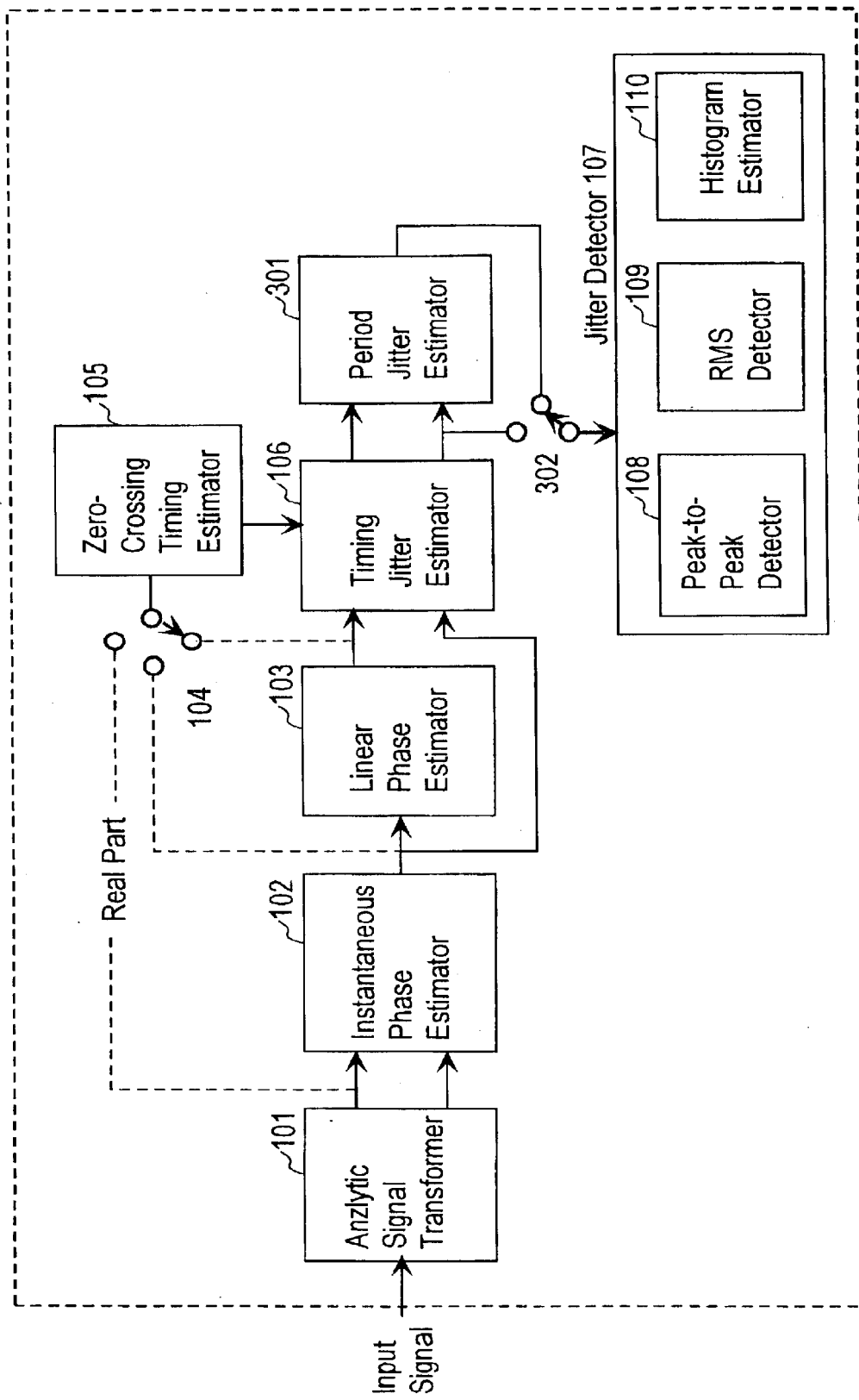
FIG. 31 is a diagram showing another example of the configuration of the jitter measurement apparatus according to tie present invention.

FIG. 31 shows another example of the configuration of the jitter measurement apparatus used in the embodiment of the present invention. This jitter measurement apparatus 300 is same as the jitter measurement apparatus shown in FIG. 29 except that the jitter measurement apparatus 300 comprises a period jitter estimation means 301 having as an input a timing jitter sequence obtained from the timing jitter estimation means 106 shown in FIG. 29 for calculating a differential waveform of the timing jitter sequence to output a period jitter sequence, and a switch 302 for selecting a jitter sequence from the timing jitter estimation means 106 or the period jitter estimation means 301 (in order to simplify the description, the explanation of the duplicated portions will be omitted). In this case, the jitter detection means 107 obtains jitters (a peak-to-peak value, an RMS value, and a histogram) of the signal under measurement from the timing jitter sequence or the period jitter sequence.

Figure 32:
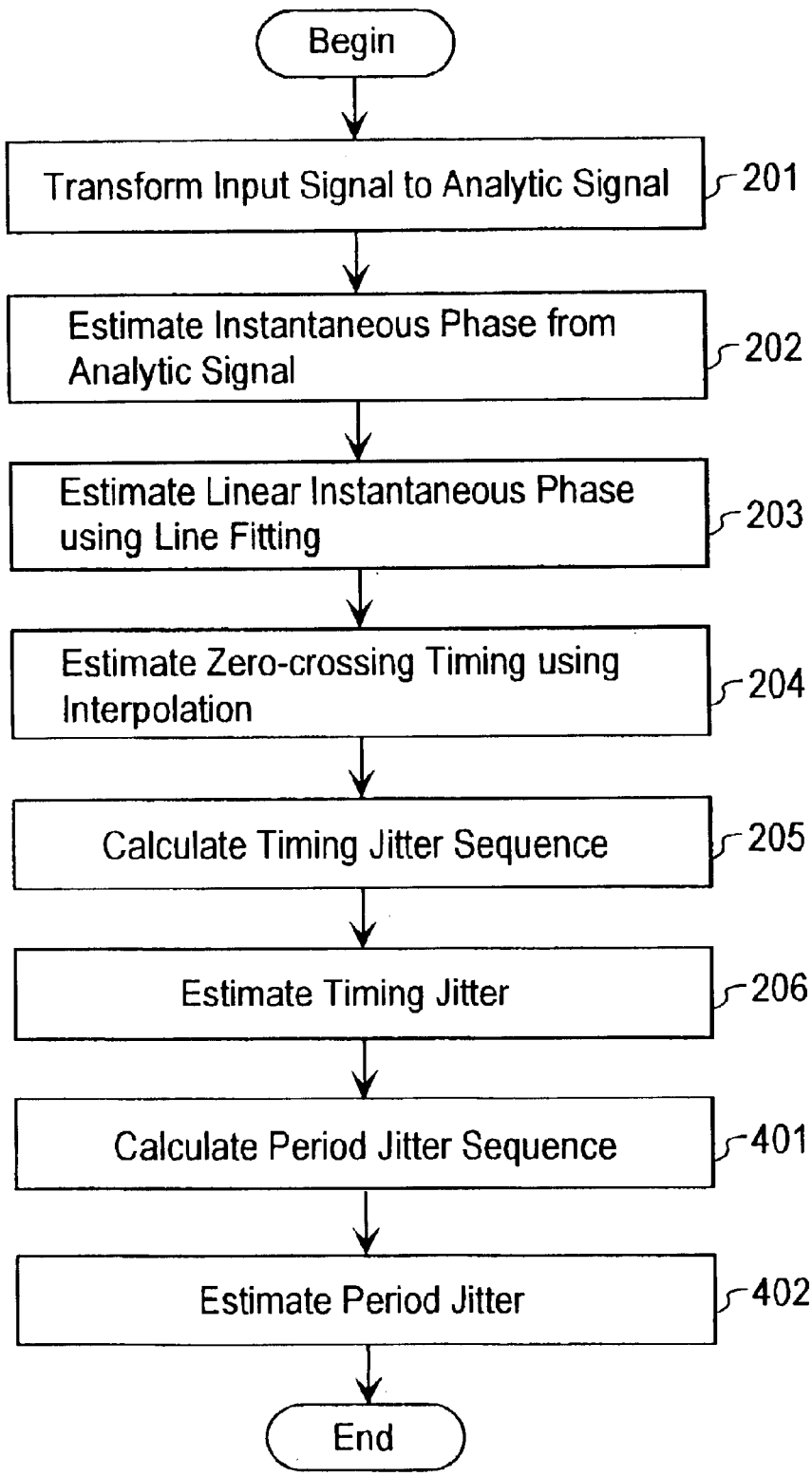
FIG. 32 is a flow-chart showing another example of the jitter measurement method according to the present invention.

Next, the operation in the case of performing a jitter measurement of a signal under measurement using the jitter measurement apparatus 300 according to the present invention will be described. FIG. 32 shows another processing procedure of the jitter measurement method according to the present invention. This jitter measurement method is same as the jitter measurement method shown in FIG. 30 except that this jitter measurement method comprises a step 401 for calculating by the period jitter estimation means 301, after obtaining a timing jitter of the signal under measurement from the timing jitter sequence obtained by the processing procedure similar to the steps up to 206 in FIG. 30, a differential waveform of the timing jitter sequence estimated by the timing jitter estimation means 106, and a step 402 for obtaining a period jitter of the signal under measurement from the period jitter sequence in the state that the switch 302 connects the jitter detection means 107 to the period jitter estimation means 301 (in order to simplify the description, the explanation of the duplicated portions will be omitted). In the step 402 for obtaining a period jitter of the signal under measurement, the peak-to-peak detection means 108 obtains a peak-to-peak value of period jitter using the equation (6), the RMS detection means 109 obtains an RMS value of period jitter using the equation (5), and the histogram estimation means 110 obtains a histogram from the period jitter sequence.

The jitter measurement apparatus shown in FIG. 31 can also be configured as an apparatus for estimating an only period jitter. In this case, the switch 302 for selecting a jitter sequence is omitted. Similarly, the jitter measurement method shown in FIG. 32 may estimate an only period jitter. In this case, the step 206 for estimating a timing jitter from the timing jitter sequence is omitted.

Figure 33:
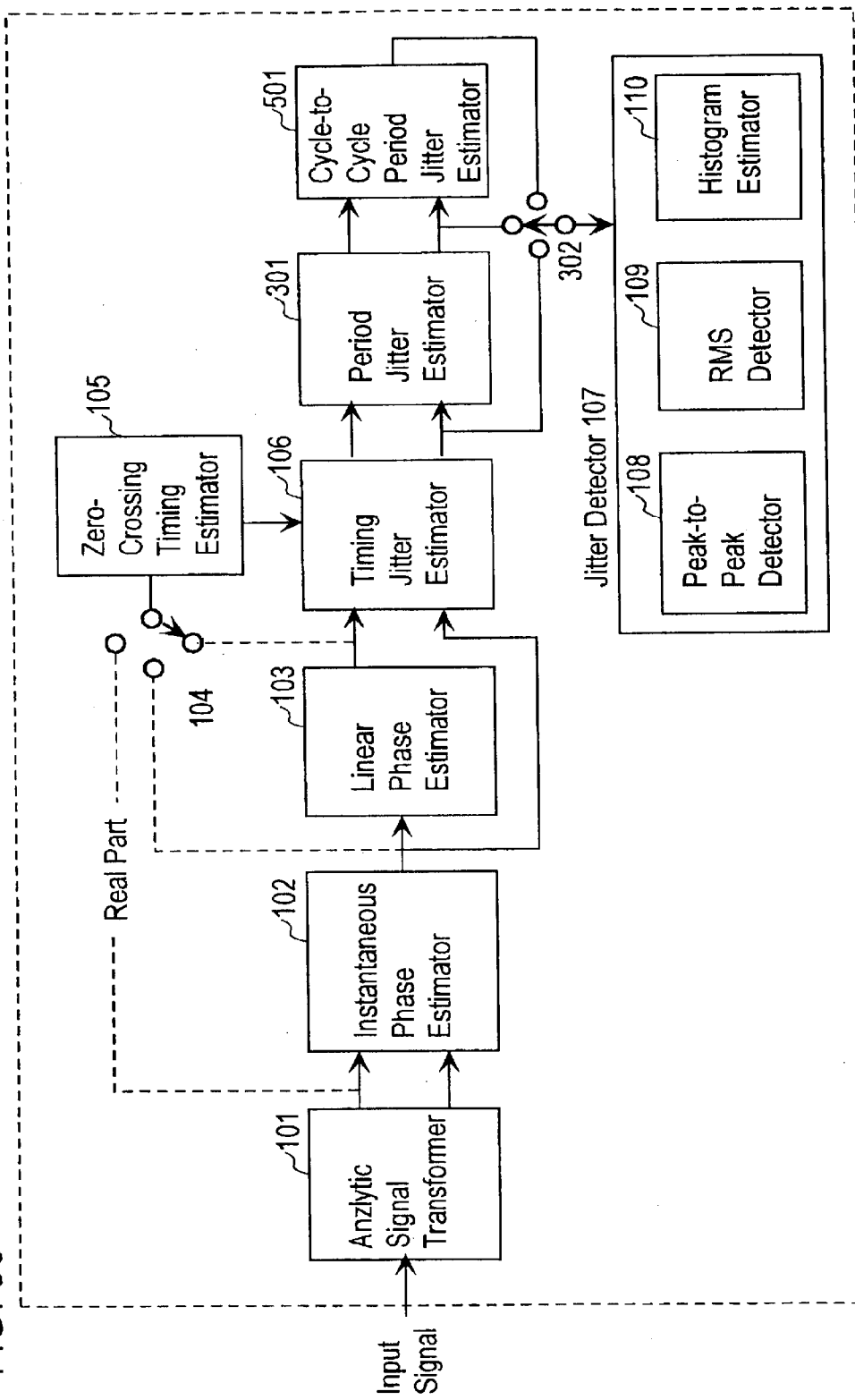
FIG. 33 is a diagram showing further another example of the configuration of the jitter measurement apparatus according to the present invention.

FIG. 33 shows another example of the configuration of the jitter measurement apparatus used in the embodiment of the present invention. This jitter measurement apparatus 500 is same as the jitter measurement apparatus shown in FIG. 31 except that the jitter measurement apparatus 500 comprises cycle-to-cycle period jitter estimation means 501 having as an input the period jitter sequence obtained from the period jitter estimation means 301 shown in FIG. 31 for calculating a differential waveform of the period jitter sequence to output a cycle-to-cycle period jitter sequence (in order to simplify the description, the explanation of the duplicated portions will be omitted). In this case, the switch 302 is a switch for selecting a jitter sequence from the timing jitter estimation means 106, the period jitter estimation means 301, or the cycle-to-cycle period jitter estimation means 501, and the jitter detection means 107 obtains jitters (a peak-to-peak value, an RMS value, and a histogram) of the signal under measurement from the timing jitter sequence, the period jitter sequence or the cycle-to-cycle period jitter sequence.

Figure 34:
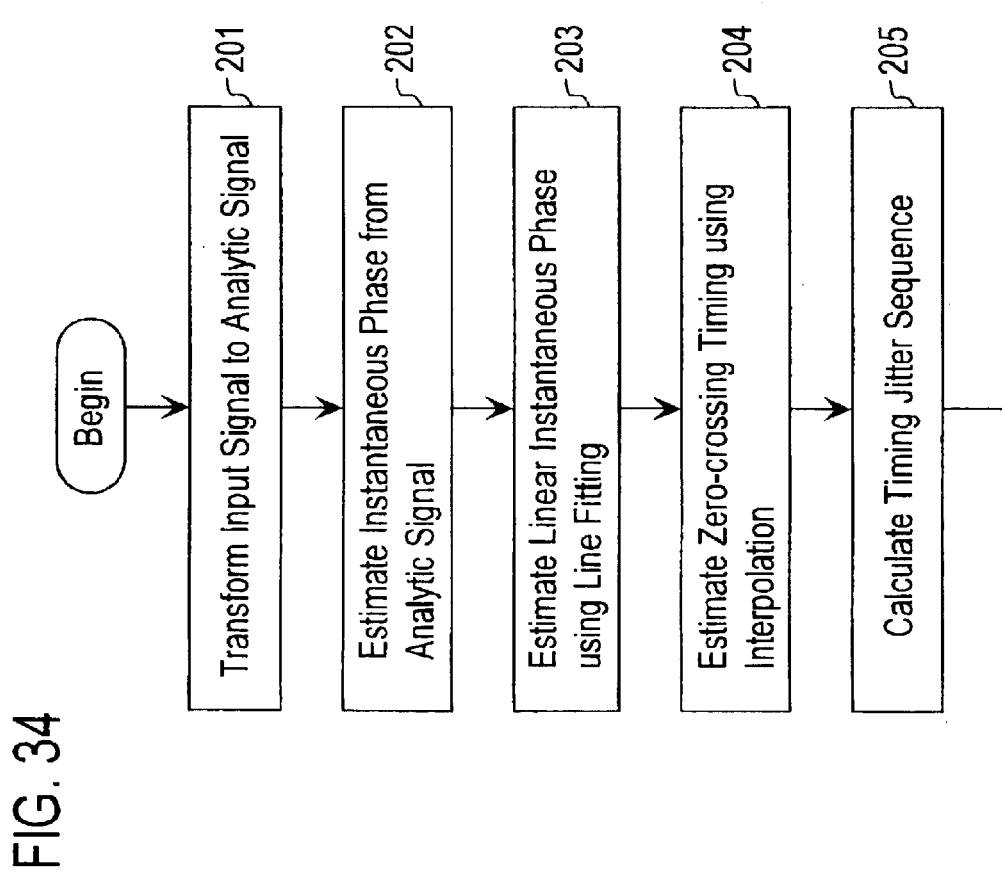
FIG. 34 is a flow-chart showing further another example of the jitter measurement method according to the present invention.

Next, the operation in the case of performing a jitter measurement of a signal under measurement using the jitter measurement apparatus 500 according to the present invention will be described. FIG. 34 shows another processing procedure of the jitter measurement method according to the present invention. This jitter measurement method is same as the jitter measurement method shown in FIG. 32 except that this jitter measurement method comprises a step 601 for obtaining by the cycle-to-cycle period jitter estimation means 501, after obtaining a period jitter of the signal under measurement from the period jitter sequence obtained by the processing procedure similar to the steps up to 402 in FIG. 32, a cycle-to-cycle period jitter sequence of the signal under measurement from the period jitter sequence estimated by the period jitter estimation means 301, and a step 602 for obtaining a cycle-to-cycle period jitter of the signal under measurement from the cycle-to-cycle period jitter sequence in the state that the switch 302 connects the jitter detection means 107 to the cycle-to-cycle period jitter estimation means 501 (in order to simplify the description, the explanation of the duplicated portions will be omitted). In the step 602 for obtaining a cycle-to-cycle period jitter of the signal under measurement, the peak-to-peak detection means 108 obtains a peak-to-peak value of cycle-to-cycle period jitter using the equation (9), the RMS detection means 109 obtains an RMS value of cycle-to-cycle period jitter using the equation (8), and the histogram estimation means 110 obtains a histogram from the cycle-to-cycle period jitter sequence.

The jitter measurement apparatus shown in FIG. 33 can also be configured as an apparatus for estimating an only cycle-to-cycle period jitter. In this case, the switch 302 for selecting a jitter sequence is omitted. Similarly, the jitter measurement method shown in FIG. 34 may estimate an only cycle-to-cycle period jitter. In this case, the step 206 for estimating a timing jitter from the timing jitter sequence and the step 402 for estimating a period jitter from the period jitter sequence are omitted.

Figure 35:
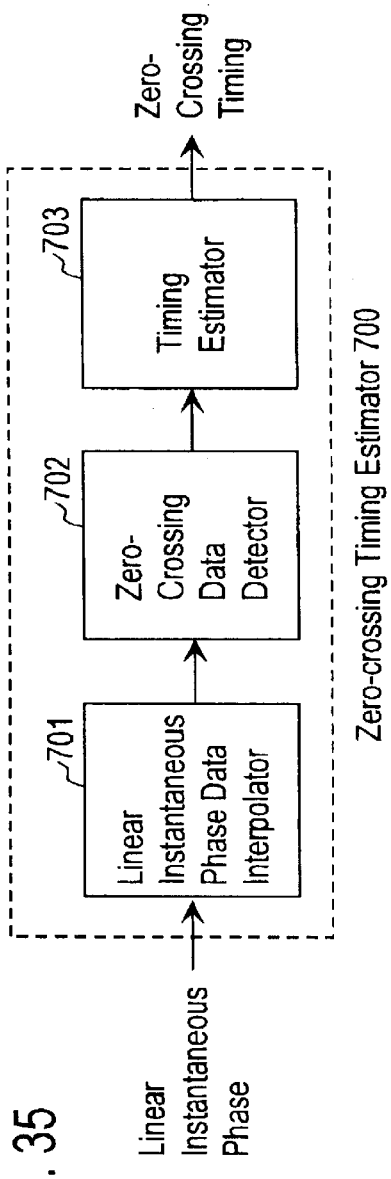
FIG. 35 is a diagram showing an example of a configuration of zero-crossing timing estimation means used in the jitter measurement apparatus according to the present invention.

FIG. 35 shows an example of a configuration of zero-crossing timing estimation means used in the jitter measurement apparatus 100 according to the present invention. The zero-crossing timing estimation means 700 comprises linear instantaneous phase data interpolation means 701 for interpolating linear instantaneous phase data between a plurality of linear instantaneous phase data around a predetermined value ($\pi/2+2n\pi$ or $3\pi/2+2n\pi$ (n=0, 1, 2, $\dddot{\text{i}}\text{i}$)) or both) in the linear instantaneous phase estimated by the linear instantaneous phase estimation means 103, zero-crossing data determination means 702 for determining a linear instantaneous phase data closest to the predetermined value in the data-interpolated linear instantaneous phase data, and timing estimation means 703 for estimating a timing of the determined data. The linear instantaneous phase data interpolation means 701 may interpolate linear instantaneous phase data using the polynomial interpolation method, may interpolate linear instantaneous phase data using the cubic spline interpolation method, or may use another interpolation method.

Figure 36:
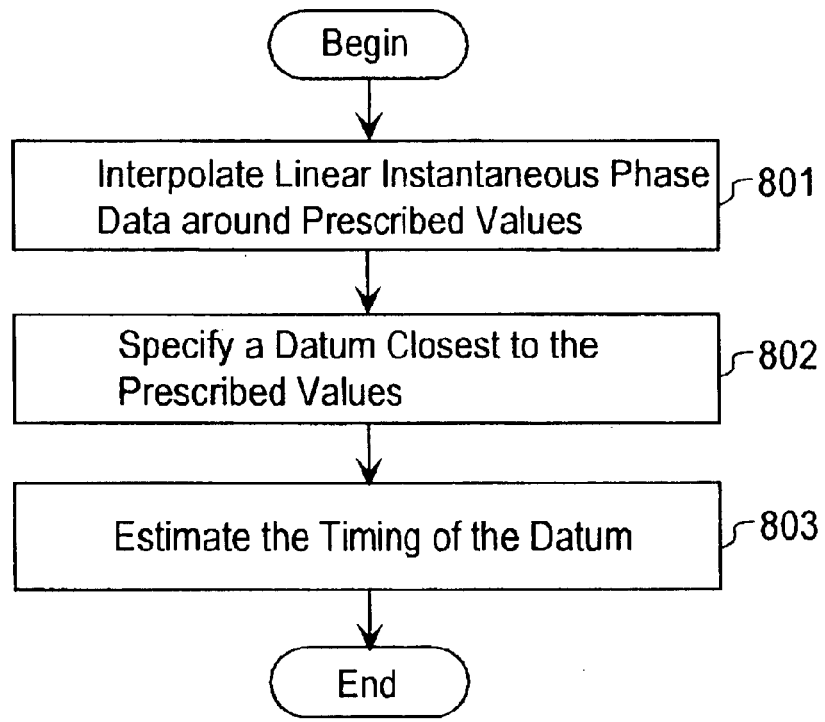
FIG. 36 is a flow-chart showing an example of a zero-crossing timing estimation method used in the jitter measurement method according to the present invention.

The operation of estimating a zero-crossing timing of a signal under measurement using this zero-crossing timing estimation means 700 will be described. FIG. 36 shows a processing procedure of the zero-crossing timing estimation method. First, in step 801, the linear instantaneous phase data interpolation means 701 interpolates in sufficient detail linear instantaneous phase data between a plurality of linear instantaneous phase data around a predetermined phase value in the linear instantaneous phase of the signal under measurement. Next, in step 802, the zero-crossing data determination means 702 determines a linear instantaneous phase data closest to the predetermined phase value in the interpolated linear instantaneous phase data. Finally, in step 803, the timing estimation means 703 obtains a timing of the determined linear instantaneous phase data on the time axis, and the process ends.

Figure 37:
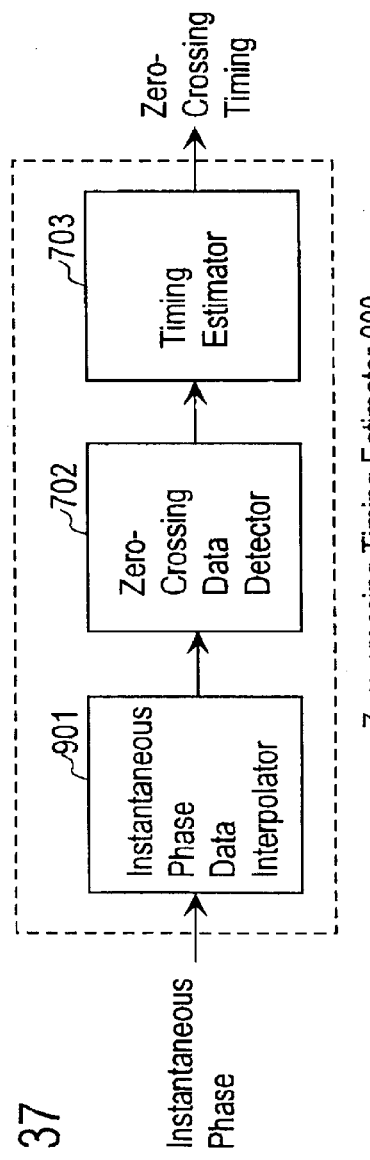
FIG. 37 is a diagram showing another example of the configuration of the zero-crossing timing estimation means used in the jitter measurement apparatus according to the present invention.

FIG. 37 shows another example of the configuration of the zero-crossing timing estimation means used in the jitter measurement apparatus 100 according to the present invention. This zero-crossing timing estimation means 900 is same as the zero-crossing timing estimation means 700 except that the linear instantaneous phase data interpolation means 701 in FIG. 35 is changed to instantaneous phase data interpolation means 901 for interpolating instantaneous phase data between a plurality of instantaneous phase data around a predetermined value ($\pi/2+2n\pi$ or $3\pi/2+2n\pi$ (n=1, 2, $\dddot{\text{i}}\text{i}$)) or both) in the instantaneous phase estimated by the instantaneous phase estimation means 102 in FIG. 29 (in order to simplify the description, the explanation of the duplicated portions will be omitted). The linear instantaneous phase data interpolation means 901 may interpolate instantaneous phase data using the polynomial interpolation method, may interpolate instantaneous phase data using the cubic spline interpolation method, or may use another interpolation method.

Figure 38:
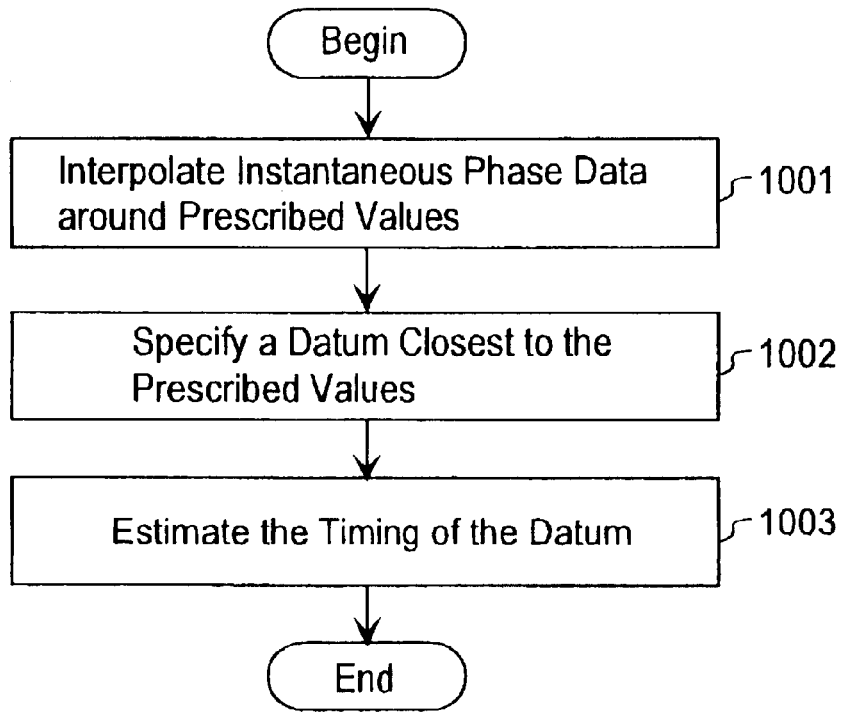
FIG. 38 is a flow-chart showing another example of the zero-crossing timing estimation method used in tie jitter measurement method according to the present invention

Next, the operation in the case of estimating a zero-crossing timing of the signal under measurement using this zero-crossing timing estimation means 900 will be described. FIG. 38 shows another processing procedure of the zero-crossing timing estimation method. First, in step 1001, the instantaneous phase data interpolation means 901 interpolates in sufficient detail instantaneous phase data between a plurality of instantaneous phase data around a predetermined phase value in the instantaneous phase of the signal under measurement. Next, in step 1002, the zero-crossing data determination means 702 determines an instantaneous phase data closest to the predetermined phase value in the interpolated instantaneous phase data. Finally, in step 1003, the timing estimation means 703 obtains a timing of the determined instantaneous phase data on the time axis, and the process ends.

Figure 39:
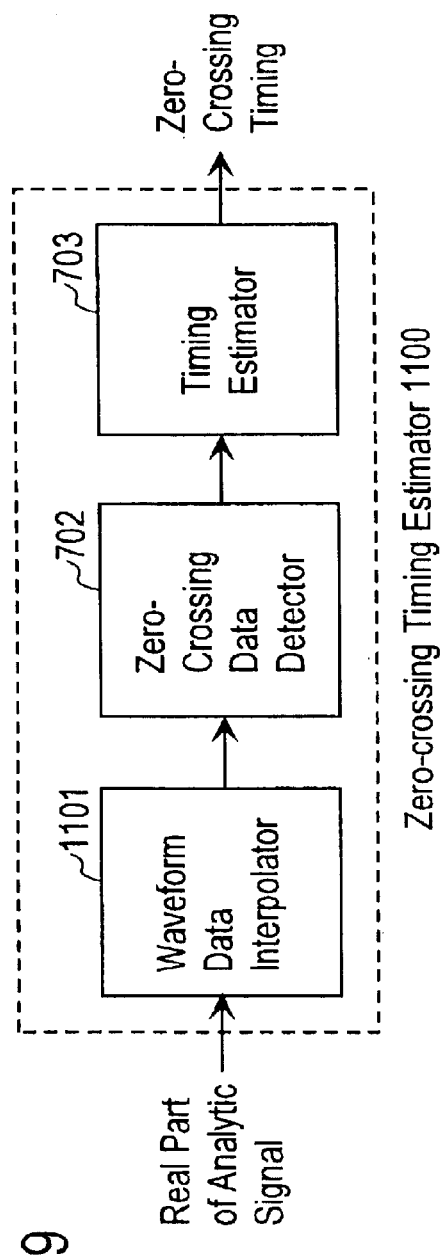
FIG. 39 is a diagram showing further another example of the configuration of the zero-crossing timing estimation means used in the jitter measurement apparatus according to the present invention.

FIG. 39 shows another example of the configuration of zero-crossing timing estimation means used in the jitter measurement apparatus 100 according to the present invention. This zero-crossing timing estimation means 1100 is same as the zero-crossing timing estimation means shown in FIG. 35 except that the linear instantaneous phase data interpolation means 701 in FIG. 35 is changed to waveform data interpolation means 1101 for interpolating waveform data between a plurality of waveform data around a zero-crossing in a real signal waveform of a complex analytic signal transformed by the analytic signal transformation means 101 (in order to simplify the description, the explanation of the duplicated portions will be omitted). The waveform data interpolation means 1101 may interpolate waveform data using the polynomial interpolation method, may interpolate waveform data using the cubic spline interpolation method, or may use another interpolation method.

Figure 40:
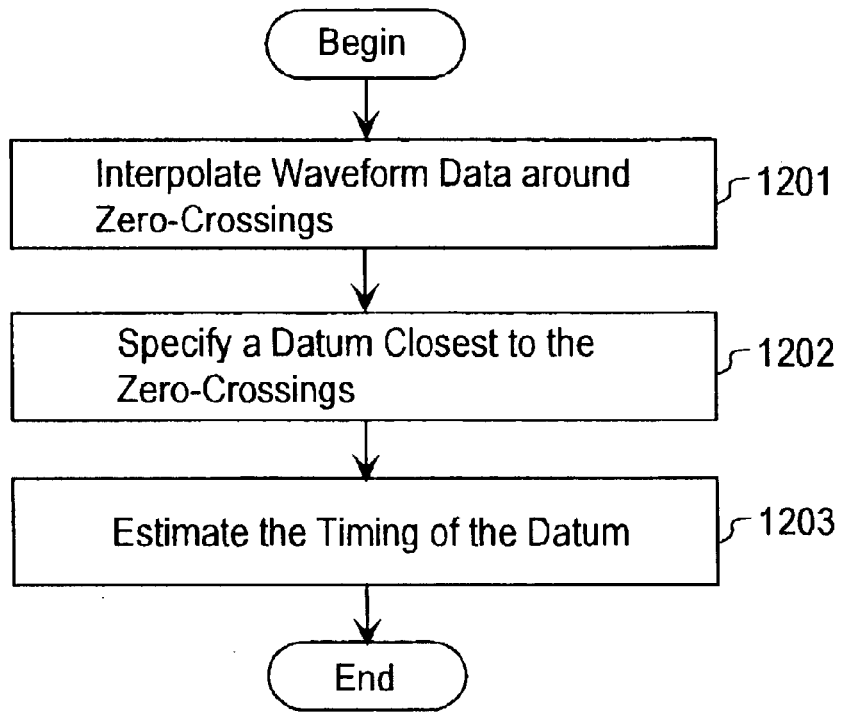
FIG. 40 is a flow-chart showing further another example of the zero-crossing tuning estimation method used in the jitter measurement method according to the present invention.

Next, the operation in the case of estimating a zero-crossing timing of the signal under measurement using this zero-crossing timing estimation means 1100 will be described. FIG. 40 shows another processing procedure of this zero-crossing timing estimation method. First, in step 1201, the waveform data interpolation means 1101 interpolates in sufficient detail waveform data between a plurality of waveform data around a zero-crossing in the real signal waveform of the analytic signal of the signal under measurement. Next, in step 1202, the zero-crossing data determination means 702 determines a waveform data closest to the zero-crossing in the interpolated waveform data. Finally, in step 1203, the timing estimation means 703 obtains a timing of the determined waveform data on the time axis, and the process ends.

Figure 41:
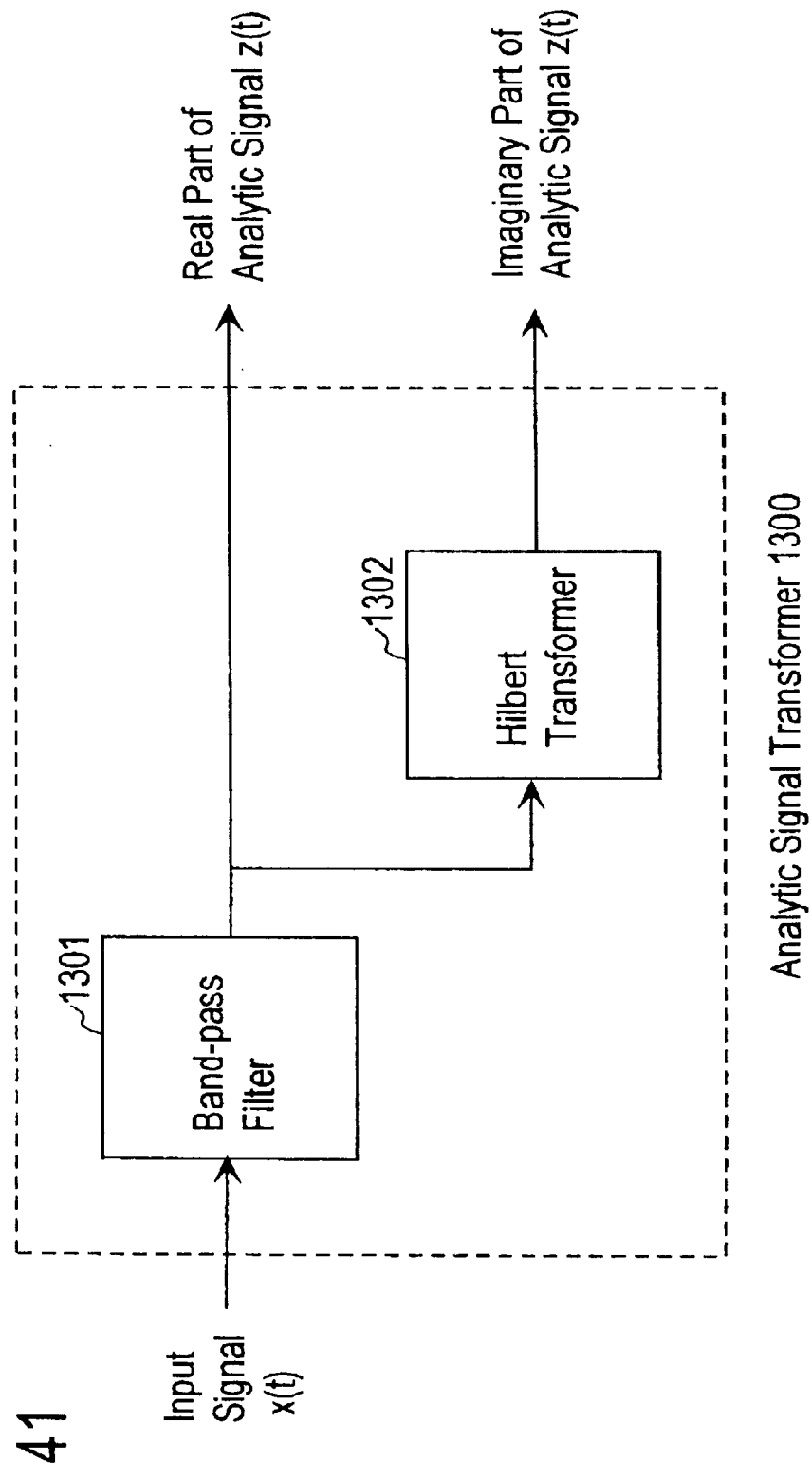
FIG. 41 is a diagram showing an example of a configuration of analytic signal transformation means used in the jitter measurement apparatus according to the present invention.

FIG. 41 shows an example of a configuration of analytic signal transformation means used in the jitter measurement apparatus 100 according to the present invention. This analytic signal transformation means 1300 comprises band-pass filtering means 1301 for extracting only components around a fundamental frequency from the signal under measurement to limit the bandwidth of the signal under measurement and Hilbert transformation means 1302 for branching and inputting therein an output signal of the band-pass filtering means 1301 to generate a Hilbert pair of the input signal. This analytic signal transformation means 1300 outputs a complex analytic signal z(t) having an output signal of the band-pass filtering means 1301 as a real part and an output signal of the Hilbert transformation means 1302 as an imaginary part. The band-pass filtering means 1301 may be an analog filter or a digital filter, or may be packaged using digital signal processing such as FFT.

Figure 42:
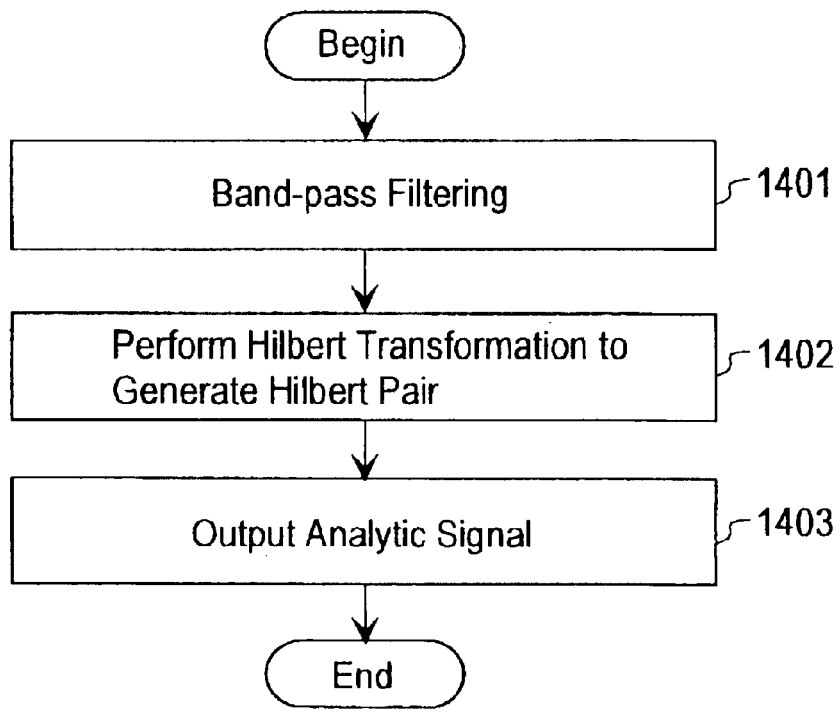
FIG. 42 is a flow-chart showing an example of a signal transformation method used in the jitter measurement method according to the present invention.

Next, the operation in the case of transforming a signal under measurement into a band-limited analytic signal using this analytic signal transformation means 1300 will be described. FIG. 42 shows a processing procedure of this signal transformation method. First, in step 1401, the band-pass filtering means 1301 extracts only components around a fundamental frequency from the signal under measurement to limit the bandwidth of the signal under measurement. Next, in step 1402, the Hilbert transformation means 1302 applies Hilbert transformation to the band-limited signal under measurement to generate a Hilbert pair of the input signal corresponding to the imaginary part of the analytic signal. Finally, in step 1430, the analytic signal transformation means 1300 outputs the output signal of the band-pass filtering means 1301 as a real part of the analytic signal and the output signal of the Hilbert transformation means 1302 as an imaginary part of the analytic signal, and the process ends.

Figure 43:
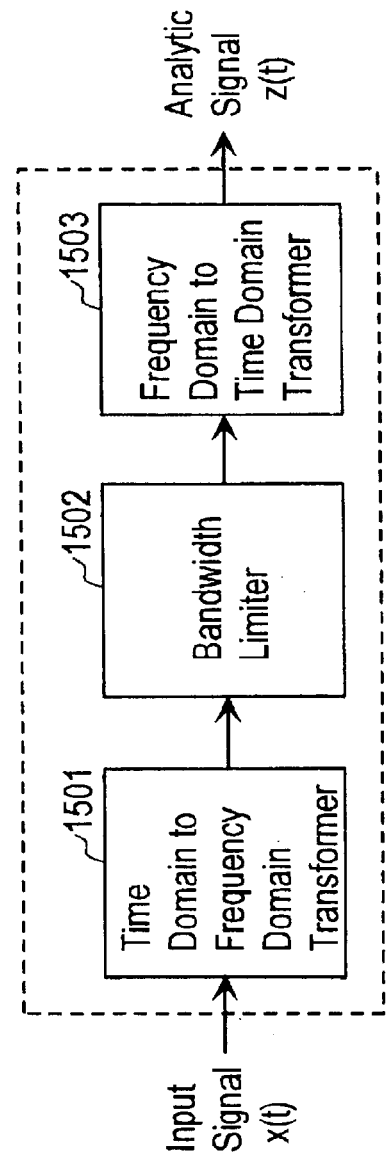
FIG. 43 is a diagram showing another example of the configuration of the analytic signal transformation means used in the jitter measurement apparatus according to the present invention.

FIG. 43 shows another example of the configuration of the analytic signal transformation means used in the jitter measurement apparatus 100 according to the present invention. This analytic signal transformation means 1500 comprises time domain to frequency domain transformation means 1501 for transforming the signal under measurement into a both-sided spectrum signal in frequency domain, bandwidth limiting means 1502 for extracting only components around a positive fundamental frequency in the both-sided spectrum signal in frequency domain, and frequency domain to time domain transformation means 1503 for inverse-transforming an output of the bandwidth limiting means into a signal in time domain. The time domain to frequency domain transformation means 1501 and the frequency domain to time domain transformation means 1503 may be packaged using FFT and inverse FFT, respectively.

Figure 44:
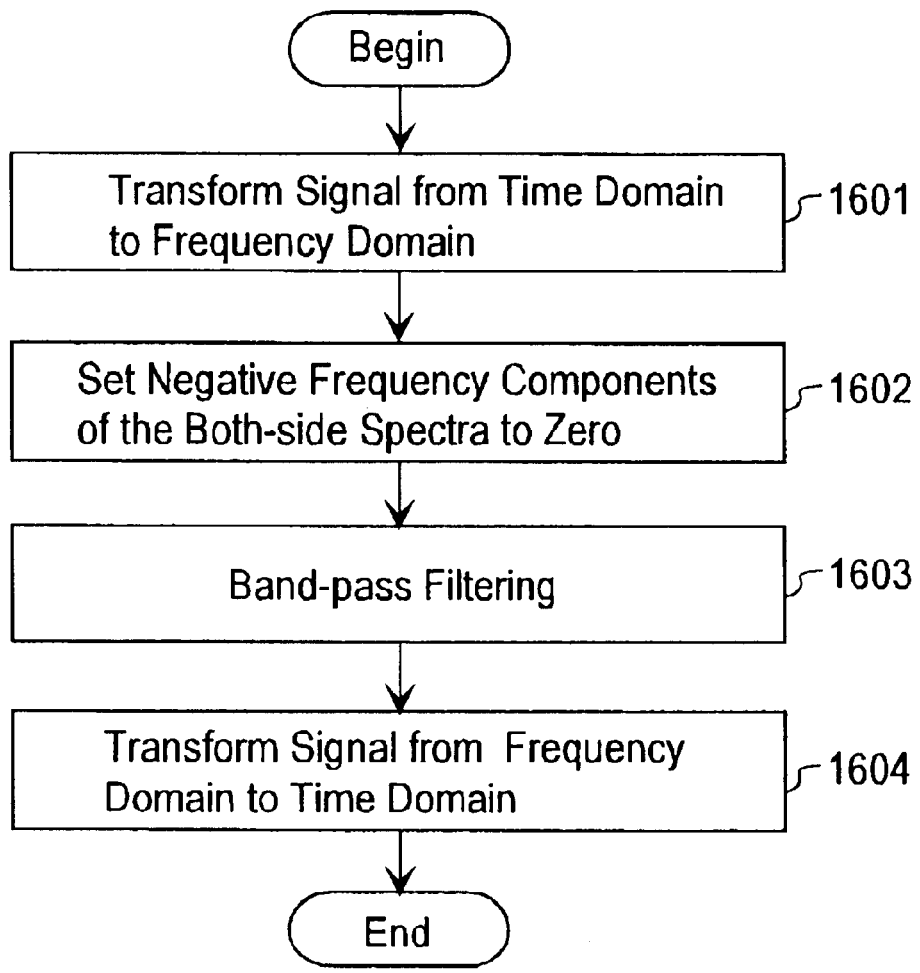
FIG. 44 is a flow-chart showing another example of the signal transformation method used in the jitter measurement method according to the present invention.

Next, the operation in the case of transforming a signal under measurement into a band-limited analytic signal using this analytic signal transformation means 1500 will be described. FIG. 44 shows another processing procedure of this signal transformation method. First, in step 1601, the time domain to frequency domain transformation means 1501 applies FFT to the signal under measurement to transform the signal in time domain into a both-sided spectrum signal in frequency domain. Next, in step 1602, the bandwidth limiting means 1502 replaces negative frequency components of the transformed both-sided spectrum signal in frequency domain with zero. Then in step 1603, the bandwidth limiting means 1502 retains only components around the fundamental frequency of the signal under measurement and replaces the other frequency components with zero in the single-sided spectrum signal produced by replacing the negative frequency components with zero to limit the bandwidth of the signal in frequency domain. Finally, in step 1604, the frequency domain to time domain transformation means 1503 applies inverse FFT to the band-limited single-sided spectrum signal to transform the signal in frequency domain into an analytic signal in time domain, and the process ends. The processing sequence of the step 1602 and the step 1603 may be changed, i.e., only components around the fundamental frequency of the signal under measurement are retained and the other frequency components are replaced with zero first to limit the bandwidth of the signal in frequency domain, and thereafter negative frequency components of the both-sided spectrum signal may be replaced with zero.

Figure 45:
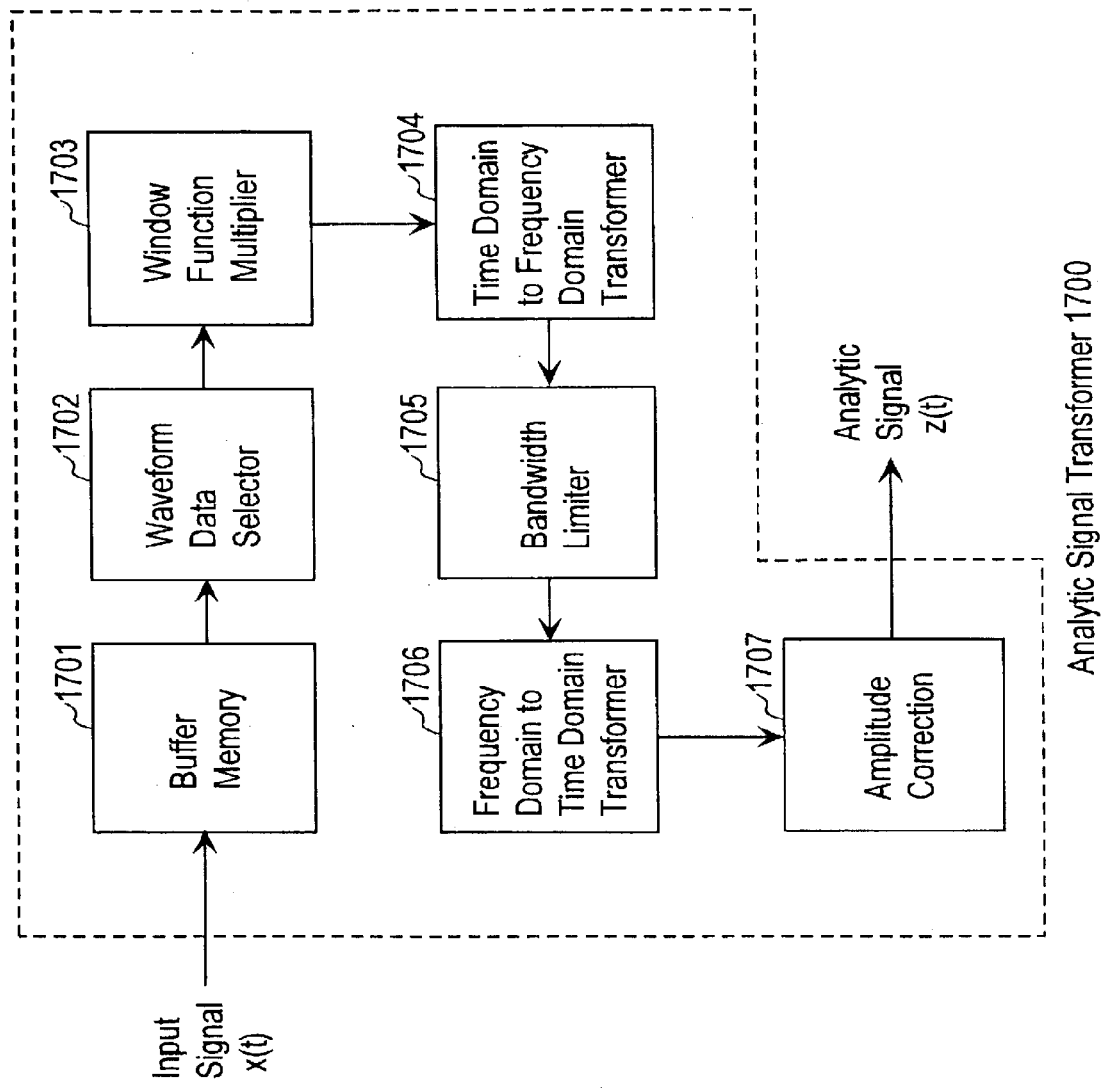
FIG. 45 is a diagram showing further another example of the configuration of the analytic signal transformation means used in the jitter measurement apparatus according to the present invention.

FIG. 45 shows another example of the configuration of the analytic signal transformation means used in the jitter measurement apparatus 100 according to the present invention. This analytic signal transformation means 1700 comprises a buffer memory 1701 for storing therein a signal under measurement, signal taking out means (waveform data selecting means) 1702 for taking out the signal in the sequential order from the buffer memory 1701 such that the signal being taken out is partially overlapped with the signal taken out just before, window function multiplication means 1703 for multiplying each taken out partial signal by a window function, time domain to frequency domain transformation means 1704 for transforming each partial signal multiplied by the window function into a both-sided spectrum signal in frequency domain, bandwidth limiting means 1705 for extracting only components around a positive fundamental frequency of the signal under measurement from the both-sided spectrum signal transformed in frequency domain, frequency domain to time domain transformation means 1706 for inverse-transforming an output of the bandwidth limiting means 1705 into a signal in time domain, and inverse window function multiplication means 1707 for multiplying the signal transformed in time domain by an inverse number of the window function to obtain a band-limited analytic signal. The time domain to frequency domain transformation means 1704 and the frequency domain to time domain transformation means 1706 may be packaged using FFT and inverse FFT, respectively.

Figure 46:
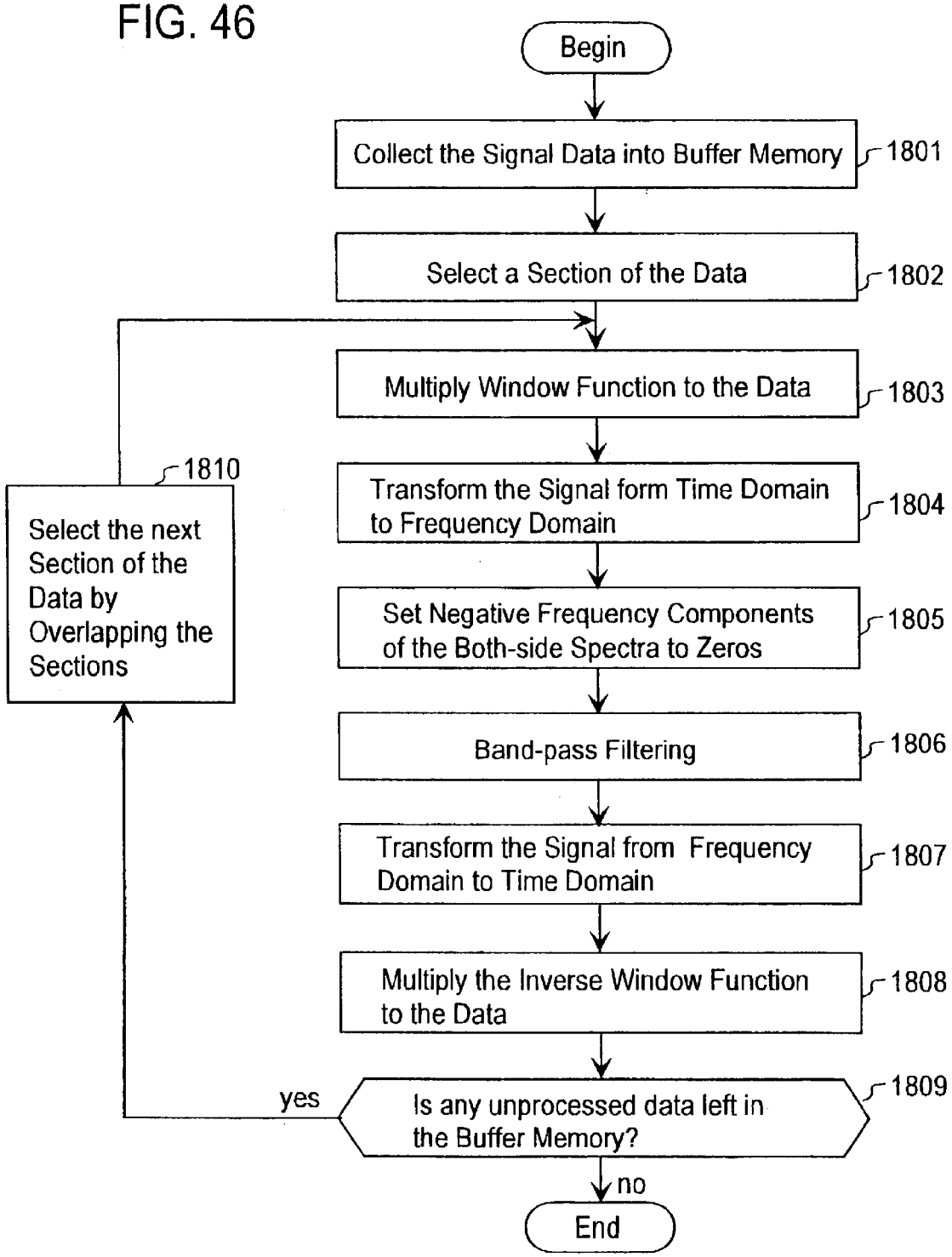
FIG. 46 is a flow-chart showing further another example of the signal transformation method used in the jitter measurement method according to the present invention.

Next, the operation in the case of transforming the signal under measurement into a band-limited analytic signal using this analytic signal transformation means 1700 will be described. FIG. 46 shows another processing procedure of this signal transformation method. First, in step 1801, the buffer memory 1701 stores therein the signal under measurement. Next, in step 1802, the signal taking out means (waveform data selecting means) 1702 takes out a portion of the stored signal from the buffer memory 1701. Next, in step 1803, the window function multiplication means 1703 multiplies the taken out partial signal by the window function. Next, in step 1804, the time domain to frequency domain transformation means 1704 applies FFT to the partial signal multiplied by the window function to transform the signal in time domain into a both-sided spectrum signal in frequency domain. Next, in step 1805, the bandwidth limiting means 1705 replaces negative frequency components of the transformed both-sided spectrum signal in frequency domain with zero. Then in step 1806, the bandwidth limiting means 1705 retains only components around the fundamental frequency of the signal under measurement in the single-sided spectrum signal produced by replacing negative frequency components with zero and replaces the other frequency components with zero to limit the bandwidth of the signal in frequency domain. Next, in step 1807, the frequency domain to time domain transformation means 1706 applies inverse FFT to the band-limited single-sided spectrum signal in time domain to transform the signal in frequency domain into a signal in time domain. Next, in step 1808, the inverse window function multiplication means 1707 multiplies the inverse-transformed signal in time domain by an inverse number of the window function multiplied in the step 1803 to obtain a band-limited analytic signal. Finally, in step 1809, a check is made to see if there is unprocessed data remaining in the buffer memory. If there is unprocessed data remaining in the buffer memory, the signal taking out means (waveform data selecting means) 1702 takes out, in step 1810, the signal in the sequential order from the buffer memory 1701 such that the signal being taken out is partially overlapped with the signal taken out just before, and thereafter the steps 1803, 1804, 1805, 1806, 1807, 1808 and 1809 are repeated. If there is no unprocessed data, the process ends. The processing sequence of the step 1805 and the step 1806 may be changed, i.e., only components around the fundamental frequency of the signal under measurement are retained and the other frequency components are replaced with zero first to limit the bandwidth of the signal in frequency domain, and thereafter negative frequency components of the both-sided spectrum signal may be replaced with zero.

Figure 47:
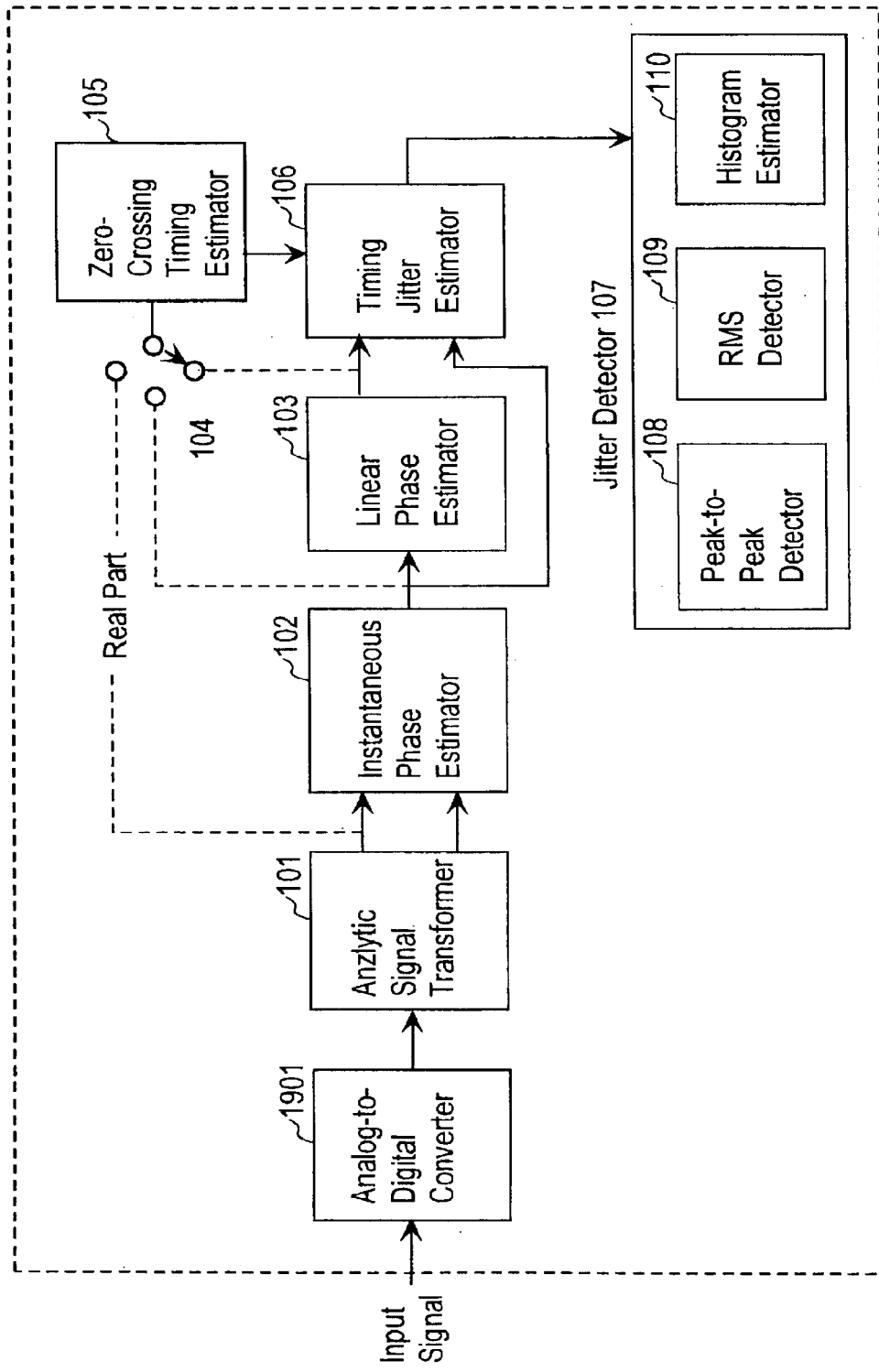
FIG. 47 is a diagram showing another example of the configuration of the jitter measurement apparatus according to the present invention.

FIG. 47 shows another embodiment of the configuration of the jitter measurement apparatus according to the present invention. This jitter measurement apparatus 1900 is same as the jitter measurement apparatus shown in FIG. 29 except that the jitter measurement apparatus 1900 includes AD conversion means 1901 for digitizing an analog signal under measurement to convert it to a digital signal (in order to simplify the description, the explanation of the duplicated portions will be omitted). It is desirable that a high speed AD converter, digitizer, or digital sampling oscilloscope is used as the AD conversion means.

Figure 48:
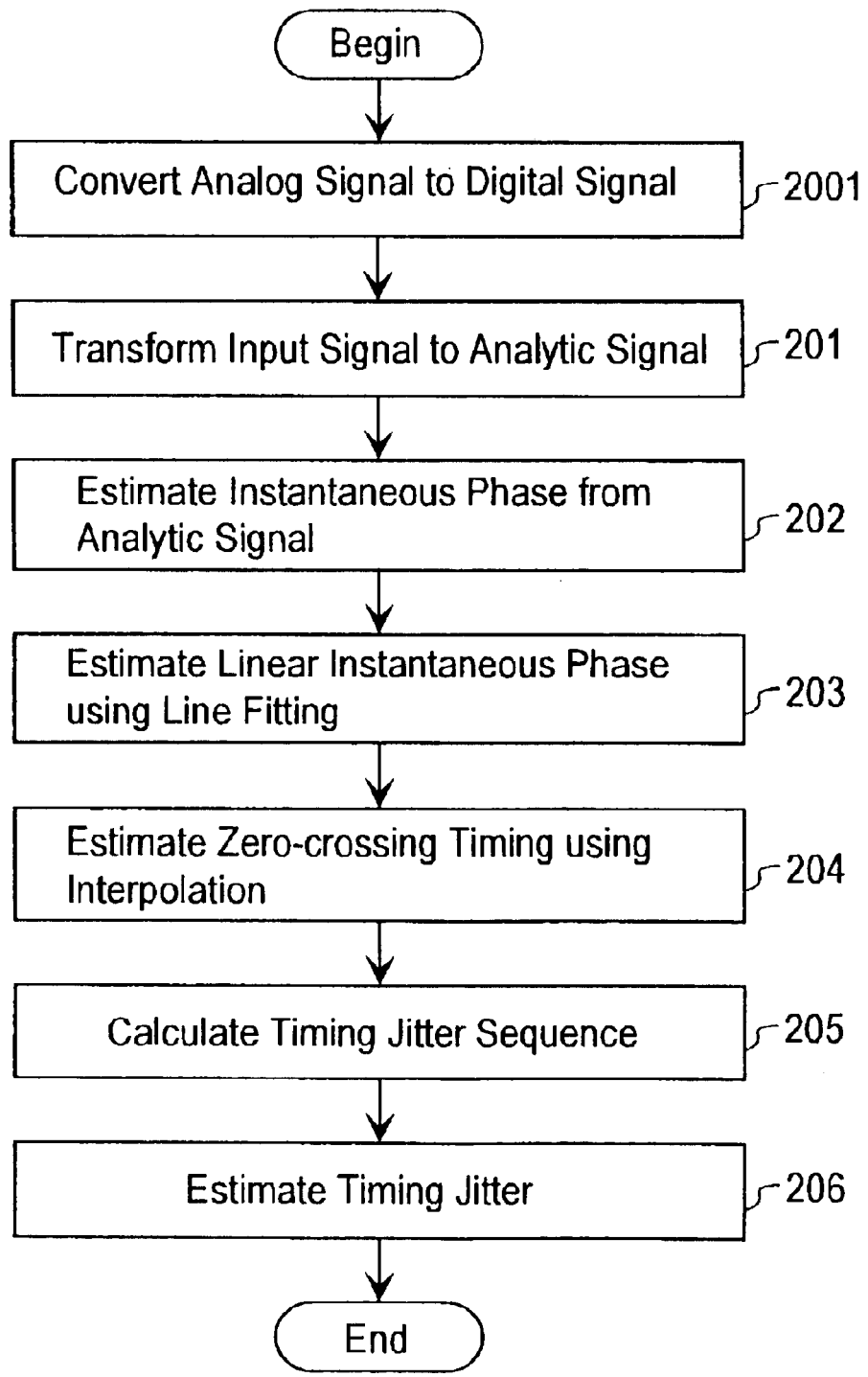
FIG. 48 is a flow-chart showing another example of the jitter measurement method according to the present invention.

Next, the operation in the case of performing a jitter measurement of a signal under measurement using the jitter measurement apparatus 1900 will be described. FIG. 48 shows another processing procedure of the jitter measurement method according to the present invention. This jitter measurement method is same as the jitter measurement method shown in FIG. 30 except that this jitter measurement method includes, at the beginning of the process, a step 2001 for sampling (digitizing) an analog signal under measurement whose jitter is to be measured and for converting it to a digital signal (in order to simplify the description, the explanation of the duplicated portions will be omitted).

The AD conversion means can also be built in the jitter measurement apparatus 300 having the period jitter estimation means shown in FIG. 31. In addition, the AD conversion means may also be built in the jitter measurement apparatus 500 having the cycle-to-cycle period jitter estimation means shown in FIG. 33. In this case, each of the processing procedures of the jitter measurement method shown in FIGS. 32 and 34 includes, at the beginning of the process, a step in which the AD conversion means samples (digitizes) an analog signal under measurement whose jitter is to be measured and converts it to a digital signal.

Figure 49:
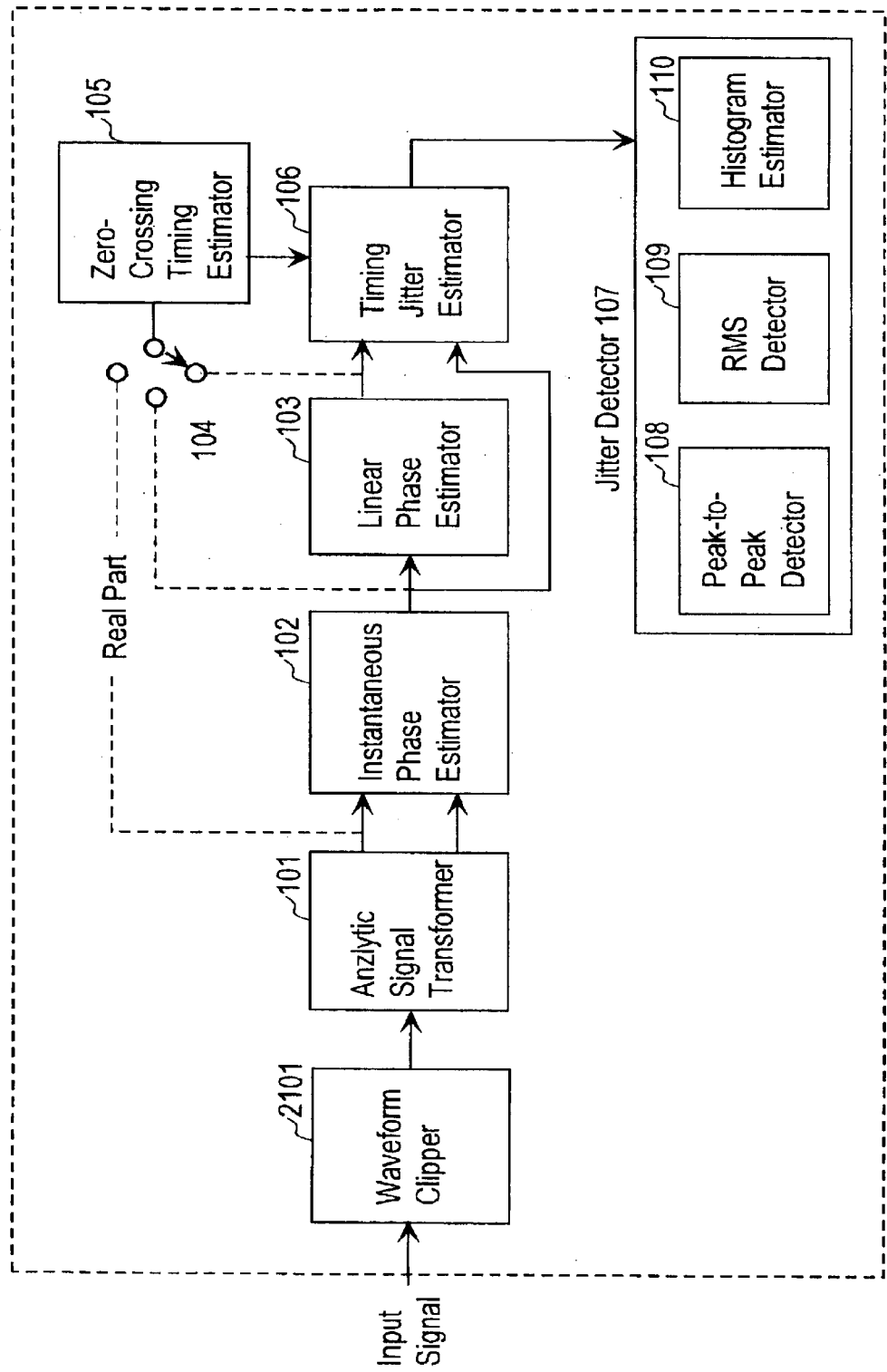
FIG. 49 is a diagram showing further another example of the configuration of the jitter measurement apparatus according to the present invention.

FIG. 49 shows another embodiment of the configuration of the jitter measurement apparatus according to the present invention. This jitter measurement apparatus 2100 is same as the jitter measurement apparatus shown in FIG. 29 except that the jitter measurement apparatus 2100 includes waveform clipping means 2101 for removing AM components of the signal (in order to simplify the description, the explanation of the duplicated portions will be omitted).

Figure 50:
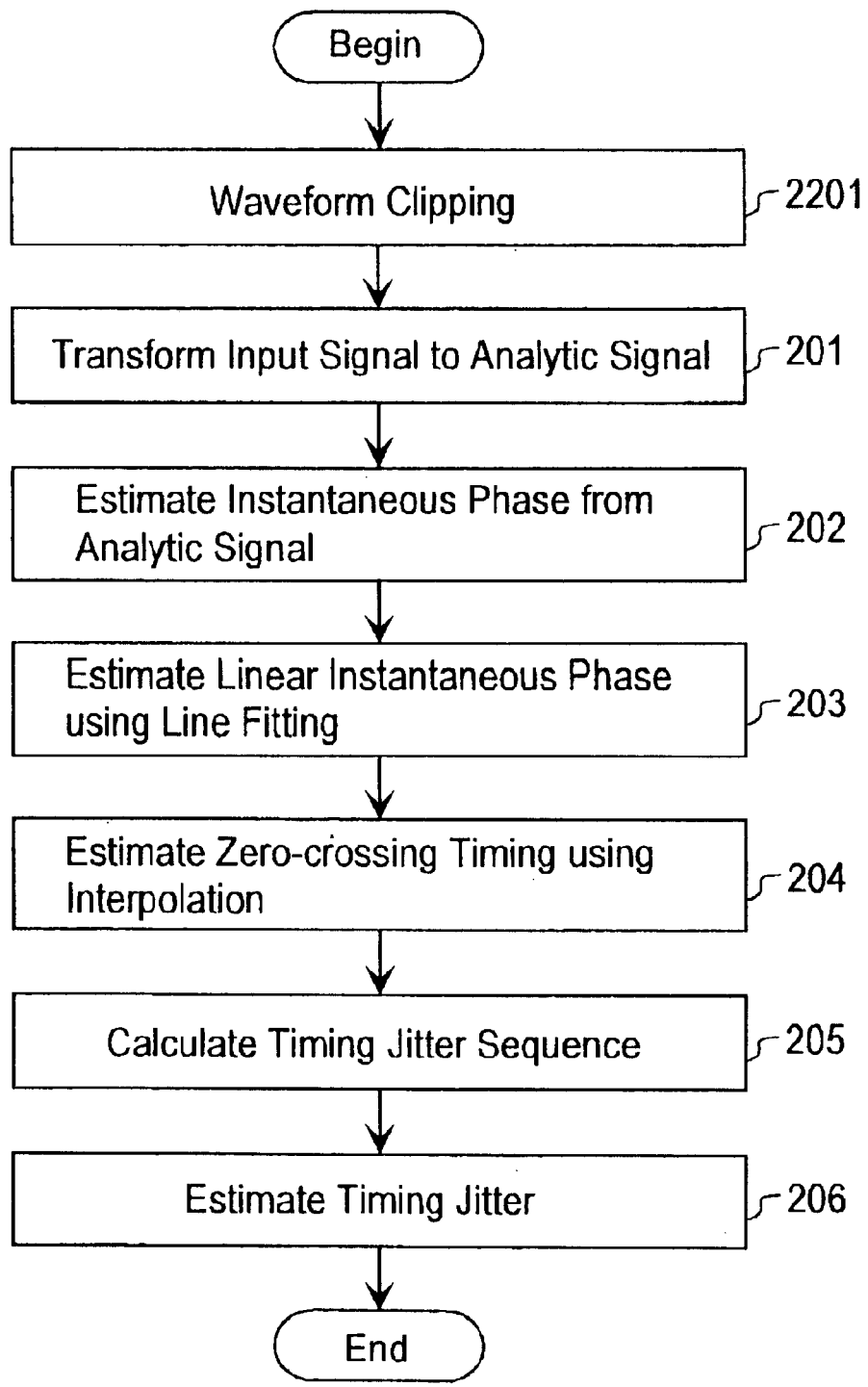
FIG. 50 is a flow-chart showing further another example of the jitter measurement method according to the present invention.

Next, the operation in the case of performing a jitter measurement of a signal under measurement using the jitter measurement apparatus 2100 will be described. FIG. 50 shows another processing procedure of the jitter measurement method. This jitter measurement method is same as the jitter measurement method shown in FIG. 30 except that this jitter measurement method includes a step 2201 in which the waveform clipping means 2101 removes, at the beginning of the process, AM components of the signal under measurement (in order to simplify the description, the explanation of the duplicated portions will be omitted).

The waveform clipping means can also be built in the jitter measurement apparatus 300 having the period jitter estimation means shown in FIG. 31. In addition, the waveform clipping means may also be built in the jitter measurement apparatus 500 having the cycle-to-cycle period jitter estimation means shown in FIG. 33. In this case, each of the processing procedures of the jitter measurement apparatus shown in FIGS. 32 and 34 includes, at the beginning of the process, a step in which the waveform clipping means removes AM components of the signal under measurement.

As mentioned above, according to the jitter measurement apparatus and the jitter measurement method according to the present invention, by estimating an instantaneous phase from signal data sampled at high speed, and by obtaining phase fluctuation components at a zero-crossing timing estimated using an interpolation method with high accuracy, period jitter values compatible with the conventional time interval analyzer method and Δφ method can be estimated. Therefore, accuracy of the jitter measurement (using interpolation-based jitter measurement method) using the conventional oscilloscope can significantly be improved. In addition, since a simultaneous measurement of a timing jitter, a period jitter, and a cycle-to-cycle period jitter that is impossible in the conventional time interval analyzer method and interpolation-based jitter measurement method becomes possible, the efficiency of the jitter measurement can also be improved greatly.

Since there is no dead time in this jitter measurement, the measurement time can be reduced compared with the conventional time interval analyzer method.

What is claimed is:

1. A jitter measurement apparatus comprising:
   an analytic signal transformer for transforming a signal under measurement into a complex analytic signal;
   an instantaneous phase estimator for obtaining an instantaneous phase of the signal under measurement from the complex analytic signal transformed by said analytic signal transformer;
   a linear instantaneous phase estimator for obtaining a linear instantaneous phase of an ideal signal that does not contain a jitter by obtaining a least mean square line of the estimated instantaneous phase;
   a zero-crossing timing estimator for obtaining a zero-crossing timing of the signal under measurement using any one of an interpolation method and an inverse interpolation method;
   a timing jitter estimator for calculating a difference between an instantaneous phase value of the signal under measurement and a linear instantaneous phase value of the ideal signal at the zero-crossing timing estimated by said zero-crossing timing estimator to obtain a timing jitter sequence; and
   a jitter detector to which the timing jitter sequence is supplied for obtaining a jitter of the signal under measurement.

2. The jitter measurement apparatus according to claim 1 further comprising:
   a period jitter estimator to which the timing jitter sequence is inputted for calculating its differential sequence and for outputting a period jitter sequence of the signal under measurement to supply it to said jitter detector.

3. The jitter measurement apparatus according to claim 1 further comprising:
   a period jitter estimator to which the timing jitter sequence is inputted for calculating its differential sequence and for outputting a period jitter sequence of the signal under measurement; and
   a cycle-to-cycle period jitter estimator to which the period jitter sequence is inputted for calculating its differential sequence and for outputting a cycle-to-cycle period jitter sequence to supply it to said jitter detector.

4. The jitter measurement apparatus according to any one of claims 1–3 wherein said zero-crossing timing estimator comprises:
   a linear instantaneous phase data interpolator to which the linear instantaneous phase data are supplied for interpolating linear instantaneous phase data between a plurality of linear instantaneous phase data around a predetermined phase value in the linear instantaneous phase data;
   zero-crossing data determination means for determining a data closest to the predetermined value in the data-interpolated linear instantaneous phase data; and
   a timing estimator for estimating a timing of the determined data.

5. The jitter measurement apparatus according to any one of claims 1–3 wherein said zero-crossing timing estimator comprises:
   an instantaneous phase data interpolator to which the instantaneous phase data are supplied for interpolating instantaneous phase data between a plurality of instantaneous phase data around a predetermined phase value in the instantaneous phase data;
   zero-crossing data determination means for determining a data closest to the predetermined phase value in the data-interpolated instantaneous phase data; and
   a timing estimator for estimating a timing of the determined data.

6. The jitter measurement apparatus according to any one of claims 1–3 wherein said zero-crossing timing estimator comprises:
   a waveform data interpolator to which real part waveform data of the complex analytic signal are supplied for interpolating waveform data between a plurality of waveform data around a zero-crossing in the real part waveform data;
   zero-crossing data determination means for determining a waveform data closest to the zero-crossing in the data-interpolated real signal waveform data; and
   a timing estimator for estimating a timing of the determined data.

7. The jitter measurement apparatus according to any one of claims 1–3 wherein said zero-crossing timing estimator is means to which any one data group out of the linear instantaneous phase data group, the instantaneous phase data group and the real part waveform data group of the complex analytic signal is supplied for estimating a zero-crossing timing, by an inverse interpolation method, from a plurality of data around a predetermined value in the supplied data group and for outputting the zero-crossing timing.

8. The jitter measurement apparatus according to any one of claims 1–3 wherein said analytic signal transformer comprises:
   a band-pass filter to which the signal under measurement is supplied for extracting only components around a fundamental frequency from the signal under measurement to limit the bandwidth of the signal under measurement; and
   a Hilbert transformer for Hilbert-transforming an output signal of said band-pass filter to generate a Hilbert pair of the input signal.

9. The jitter measurement apparatus according to any one of claims 1–3 wherein said analytic signal transformer comprises:
   a time domain to frequency domain transformer to which the signal under measurement is supplied for transforming the signal under measurement into a both-sided spectrum signal in frequency domain;
   a bandwidth limiter for extracting only components around a positive fundamental frequency in the both-sided spectrum signal; and
   a frequency domain to time domain transformer for inverse-transforming an output of said bandwidth limiter into a signal in time domain.

10. The jitter measurement apparatus according to any one of claims 1–3 further comprising a waveform clipper to which the signal under measurement is inputted for removing amplitude modulation components of the signal under measurement to supply a signal having only phase modulation components of the signal under measurement to said analytic signal transformer.

11. The jitter measurement apparatus according to any one of claims 1–3 wherein said jitter detector is a peak-to-peak detector for obtaining a difference between the maximum value and the minimum value of the supplied jitter sequence.

12. The jitter measurement apparatus according to any one of claims 1–3 wherein said jitter detector is a root mean square detector for obtaining an RMS (root mean square) value of the supplied jitter sequence.

13. The jitter measurement apparatus according to any one of claims 1–3 wherein said jitter detector is a histogram estimator for obtaining a histogram of the supplied jitter sequence.

14. A jitter measurement method comprising the steps of:
transforming a signal under measurement into a complex analytic signal;
estimating an instantaneous phase of the signal under measurement from the complex analytic signal;
estimating a linear instantaneous phase of an ideal signal that does not contain a jitter by obtaining a least mean square line of the instantaneous phase;
estimating a zero-crossing timing of the signal under measurement using any one of an interpolation method and an inverse interpolation method;
calculating a difference between an instantaneous phase value of the signal under measurement and a linear instantaneous phase value of the ideal signal at the zero-crossing timing to estimate a timing jitter sequence; and
obtaining a jitter of the signal under measurement from the jitter sequence.

15. The jitter measurement method according to claim 14 further comprising the step of:
providing the timing jitter sequence as an input for calculating its differential sequence and for outputting a period jitter sequence of the signal under measurement.

16. The jitter measurement method according to claim 14 further comprising the steps of:
providing the timing jitter sequence as an input for calculating its differential sequence and for outputting a period jitter sequence of the signal under measurement; and
providing the period jitter sequence as an input for calculating its differential sequence and for outputting a cycle-to-cycle period jitter sequence.

17. The jitter measurement method according to any one of claims 14–16 wherein said step of estimating a zero-crossing timing comprises the steps of:
interpolating linear instantaneous phase data between a plurality of linear instantaneous phase data around a predetermined phase value in the linear instantaneous phase data;
determining a data closest to the predetermined phase value in the data-interpolated linear instantaneous phase data; and
estimating a timing of the determined data.

18. The jitter measurement method according to any one of claims 14–16 wherein said step of estimating a zero-crossing timing comprises the steps of:
interpolating instantaneous phase data between a plurality of instantaneous phase data around a predetermined phase value in the instantaneous phase data;
determining a data closest to the predetermined phase value in the data-interpolated instantaneous phase data; and
estimating a timing of the determined data.

19. The jitter measurement method according to any one of claims 14–16 wherein said step of estimating a zero-crossing timing comprises the steps of:
interpolating waveform data between a plurality of waveform data around a zero-crossing in the real part waveform data of the analytic signal;
determining a waveform data closest to the zero-crossing in the data-interpolated signal waveform data; and
estimating a timing of the determined data.

20. The jitter measurement method according to any one of claims 14–16 wherein said step of estimating a zero-crossing timing is a step in which any one data group of the linear instantaneous phase data group, the instantaneous phase data group and the real part waveform data group of the complex analytic signal is inputted for estimating a zero-crossing timing, by an inverse interpolation method, from a plurality of data around a predetermined value in the inputted data group.

21. The jitter measurement method according to claim 14 wherein said step of estimating a zero-crossing timing uses a polynomial interpolation.

22. The jitter measurement method according to claim 14 wherein a cubic spline interpolation is used for said step of estimating a zero-crossing timing.

23. The jitter measurement method according to any one of claims 14–16 wherein said step of transforming the signal under measurement into an analytic signal comprises the steps of:
extracting only components around a fundamental frequency from the signal under measurement to limit the bandwidth of the signal under measurement; and
Hilbert-transforming the band-limited signal under measurement to generate a Hilbert pair of the input signal.

24. The jitter measurement method according to any one of claims 14–16 wherein said step of transforming the signal under measurement into an analytic signal comprises the steps of:
transforming the signal under measurement into a both-sided spectrum signal in frequency domain;
extracting only components around a positive fundamental frequency in the both-sided spectrum signal; and
inverse-transforming the extracted components around the positive fundamental frequency into a signal in time domain.

25. The jitter measurement method according to any one of claims 14–16 wherein said step of transforming the signal under measurement into an analytic signal comprises the steps of:
storing the signal under measurement in a buffer memory;
taking out the signal in the sequential order from said buffer memory such that the signal being taken out is partially overlapped with the signal taken out just before;
multiplying each taken out partial signal by a window function;
transforming each partial signal multiplied by the window function into a both-sided spectrum signal in frequency domain;
extracting only components around a positive fundamental frequency of the signal under measurement from the both-sided spectrum signal transformed in frequency domain;

inverse-transforming the extracted spectrum signal having components around the positive fundamental frequency into a signal in time domain; and multiplying the signal transformed in time domain by an inverse number of the window function to obtain a band-limited analytic signal.

26. The jitter measurement method according to any one of claims 14–16 wherein said step of obtaining a jitter is a step of obtaining a difference between the maximum value and the minimum value of the jitter sequence to calculate a peak-to-peak value.

27. The jitter measurement method according to any one of claims 14–16 wherein said step of obtaining a jitter is a step of obtaining a root mean square value of the jitter sequence to calculate an RMS value.

28. The jitter measurement method according to any one of claims 14–16 wherein said step of obtaining a jitter is a step of obtaining a histogram data of the jitter sequence.

* * * * *